(12) United States Patent
Yokogawa

(10) Patent No.: US 10,910,504 B2
(45) Date of Patent: Feb. 2, 2021

(54) SOLID-STATE IMAGING ELEMENT, IMAGING DEVICE, AND METHOD FOR MANUFACTURING SOLID-STATE IMAGING ELEMENT

(71) Applicant: SONY SEMICONDUCTOR SOLUTIONS CORPORATION, Kanagawa (JP)

(72) Inventor: Sozo Yokogawa, Kanagawa (JP)

(73) Assignee: SONY SEMICONDUCTOR SOLUTIONS CORPORATION, Kanagawa (JP)

(*) Notice: Subject to any disclaimer, the term of this patent is extended or adjusted under 35 U.S.C. 154(b) by 0 days.

(21) Appl. No.: 15/777,853

(22) PCT Filed: Sep. 28, 2016

(86) PCT No.: PCT/JP2016/078614
§ 371 (c)(1),
(2) Date: May 21, 2018

(87) PCT Pub. No.: WO2017/098779
PCT Pub. Date: Jun. 15, 2017

(65) Prior Publication Data
US 2018/0351013 A1 Dec. 6, 2018

(30) Foreign Application Priority Data
Dec. 7, 2015 (JP) .................. 2015-238216

(51) Int. Cl.
*H01L 31/0236* (2006.01)
*H01L 27/14* (2006.01)
*H01L 27/146* (2006.01)
*G02B 5/20* (2006.01)
*G02B 5/30* (2006.01)
*H04N 5/225* (2006.01)
(Continued)

(52) U.S. Cl.
CPC ........ *H01L 31/02363* (2013.01); *G02B 5/201* (2013.01); *G02B 5/3025* (2013.01);
(Continued)

(58) Field of Classification Search
CPC ......... H01L 31/02363; H01L 27/14629; H01L 27/1462; H04N 5/2254
(Continued)

(56) References Cited

U.S. PATENT DOCUMENTS

| 2005/0040440 A1 | 2/2005 | Murakami |
| 2010/0282945 A1 | 11/2010 | Yokogawa |
(Continued)

FOREIGN PATENT DOCUMENTS

| CN | 1585134 A | 2/2005 |
| CN | 101887900 A | 11/2010 |
(Continued)

OTHER PUBLICATIONS

International Search Report and Written Opinion of PCT Application No. PCT/JP2016/078614, dated Dec. 6, 2016, 12 pages of ISRWO.

*Primary Examiner* — Bo Fan
(74) *Attorney, Agent, or Firm* — Chip Law Group

(57) ABSTRACT

[Object] To propose a solid-state imaging element, an imaging device, and a method for manufacturing a solid-state imaging element that are capable of providing a pixel with polarization sensitivity while suppressing the reduction in sensitivity to non-polarized incident light. [Solution] A solid-state imaging element according to the present disclosure includes: a light receiving element included in a plurality of pixels; and a groove section provided on surfaces of at least some of the pixels in the light receiving element and extended along a prescribed direction. Two or more directions including at least mutually orthogonal two directions exist as a direction in which the groove section is extended.

21 Claims, 23 Drawing Sheets

(51) Int. Cl.
  *H04N 5/369*  (2011.01)
  *H04N 5/235*  (2006.01)
  *G02B 5/22*  (2006.01)
  *G02B 5/26*  (2006.01)
(52) U.S. Cl.
  CPC ............ *H01L 27/14* (2013.01); *H01L 27/146* (2013.01); *H01L 27/1462* (2013.01); *H01L 27/1463* (2013.01); *H01L 27/14621* (2013.01); *H01L 27/14627* (2013.01); *H01L 27/14629* (2013.01); *H04N 5/2254* (2013.01); *H04N 5/2351* (2013.01); *H04N 5/36961* (2018.08); *G02B 5/22* (2013.01); *G02B 5/26* (2013.01); *G02B 5/3083* (2013.01)
(58) Field of Classification Search
  USPC .................................. 257/432, 229; 438/29
  See application file for complete search history.

(56) References Cited

U.S. PATENT DOCUMENTS

2011/0286023 A1* 11/2011 Hagisawa ............... G06K 9/346 358/1.13
2011/0286203 A1* 11/2011 Ogura ............... G02F 1/133608 362/97.1
2014/0253756 A1 9/2014 Yokogawa
2015/0062699 A1 3/2015 Hayashi
2016/0112614 A1 4/2016 Masuda et al.
2016/0190193 A1 6/2016 Yokogawa

FOREIGN PATENT DOCUMENTS

| | | |
|---|---|---|
| CN | 104427328 A | 3/2015 |
| CN | 105229790 A | 1/2016 |
| EP | 2252069 A2 | 11/2010 |
| JP | 2005-072097 A | 3/2005 |
| JP | 2010-263158 A | 11/2010 |
| JP | 2013-057769 A | 3/2013 |
| JP | 2015-029054 A | 2/2015 |
| JP | 2015-052635 A | 3/2015 |
| KR | 10-2005-0020633 A | 3/2005 |
| KR | 10-2010-0122058 A | 11/2010 |
| KR | 10-2011-0025942 A | 3/2011 |
| KR | 10-2016-0029735 A | 3/2016 |
| TW | 200524147 A | 7/2005 |
| TW | 201106470 A | 2/2011 |
| WO | 2015/001987 A1 | 1/2015 |

* cited by examiner

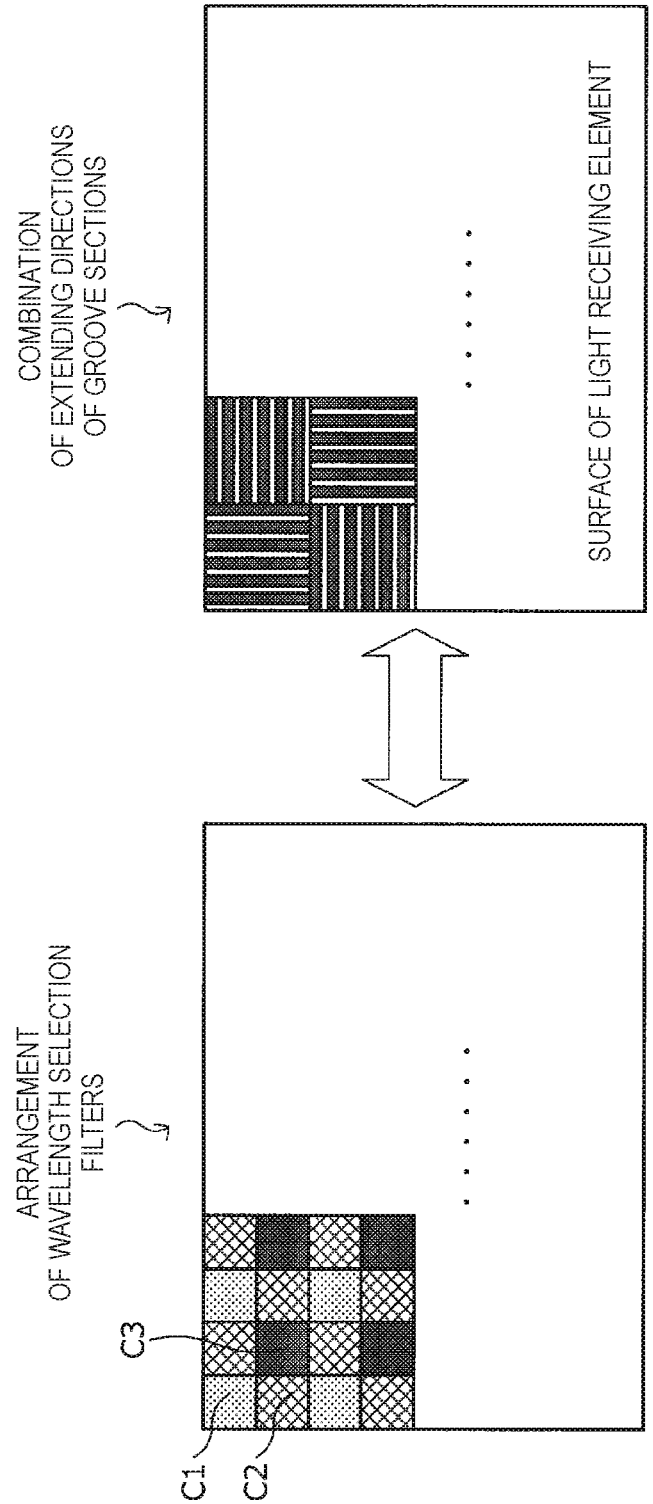

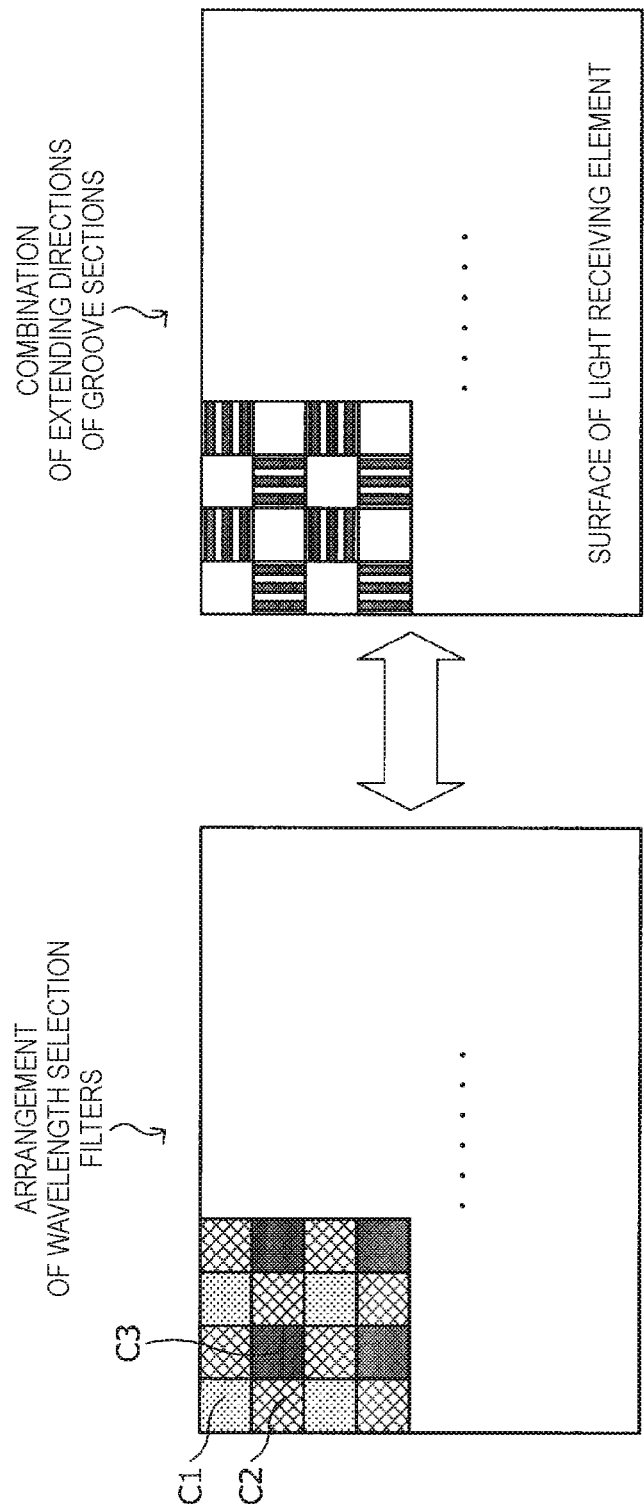

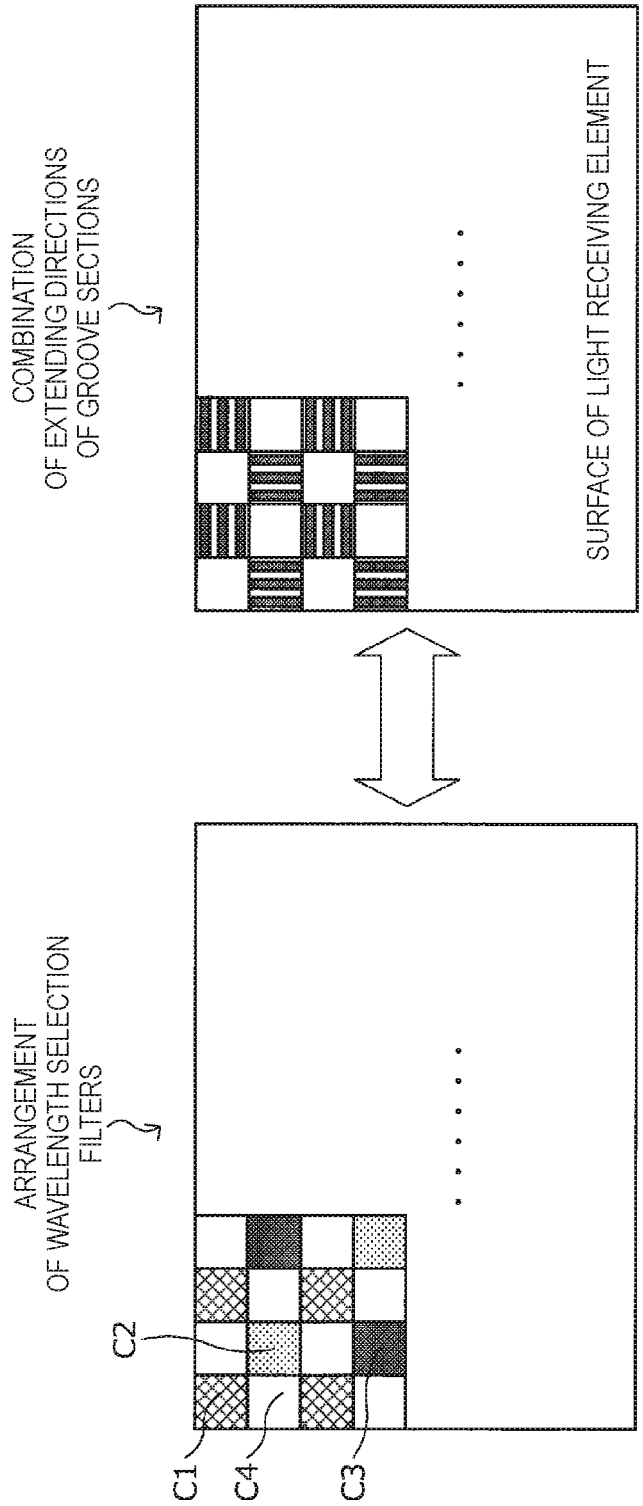

(A)

(B)

(C)

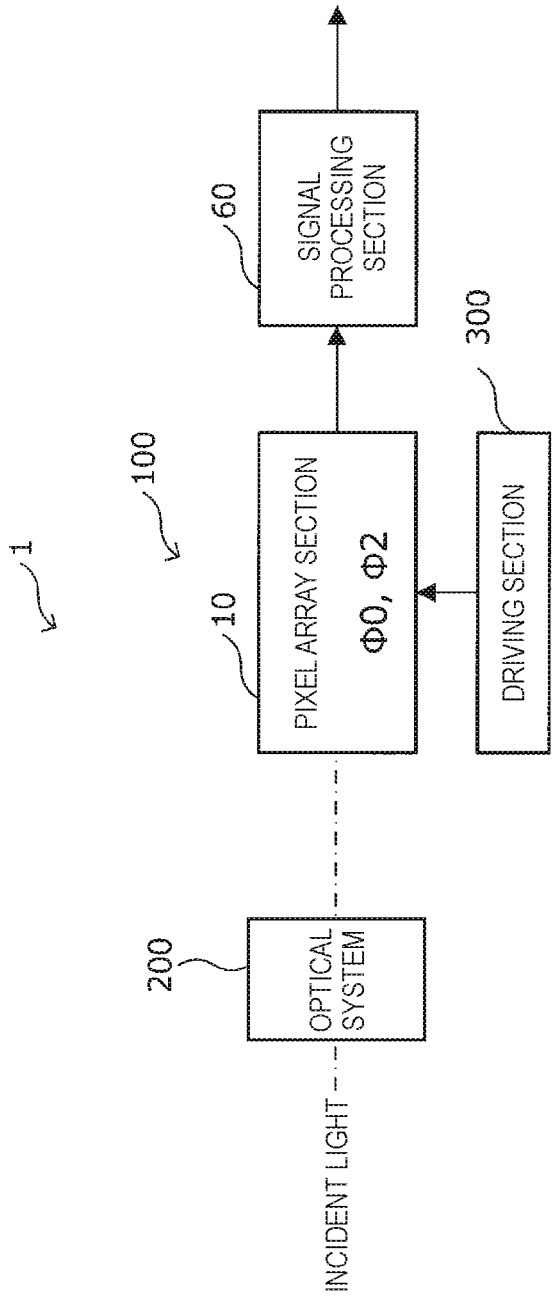

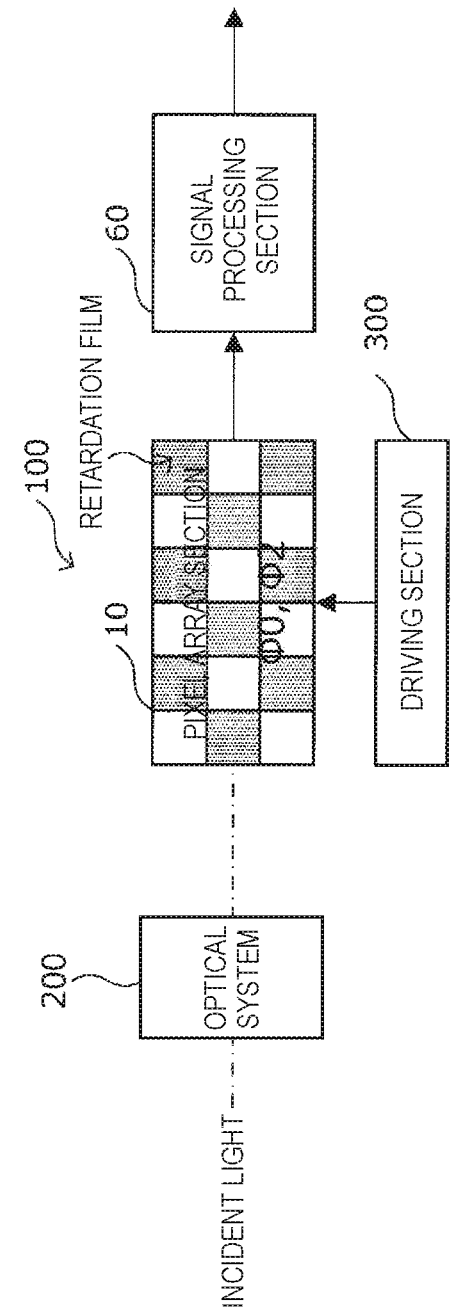

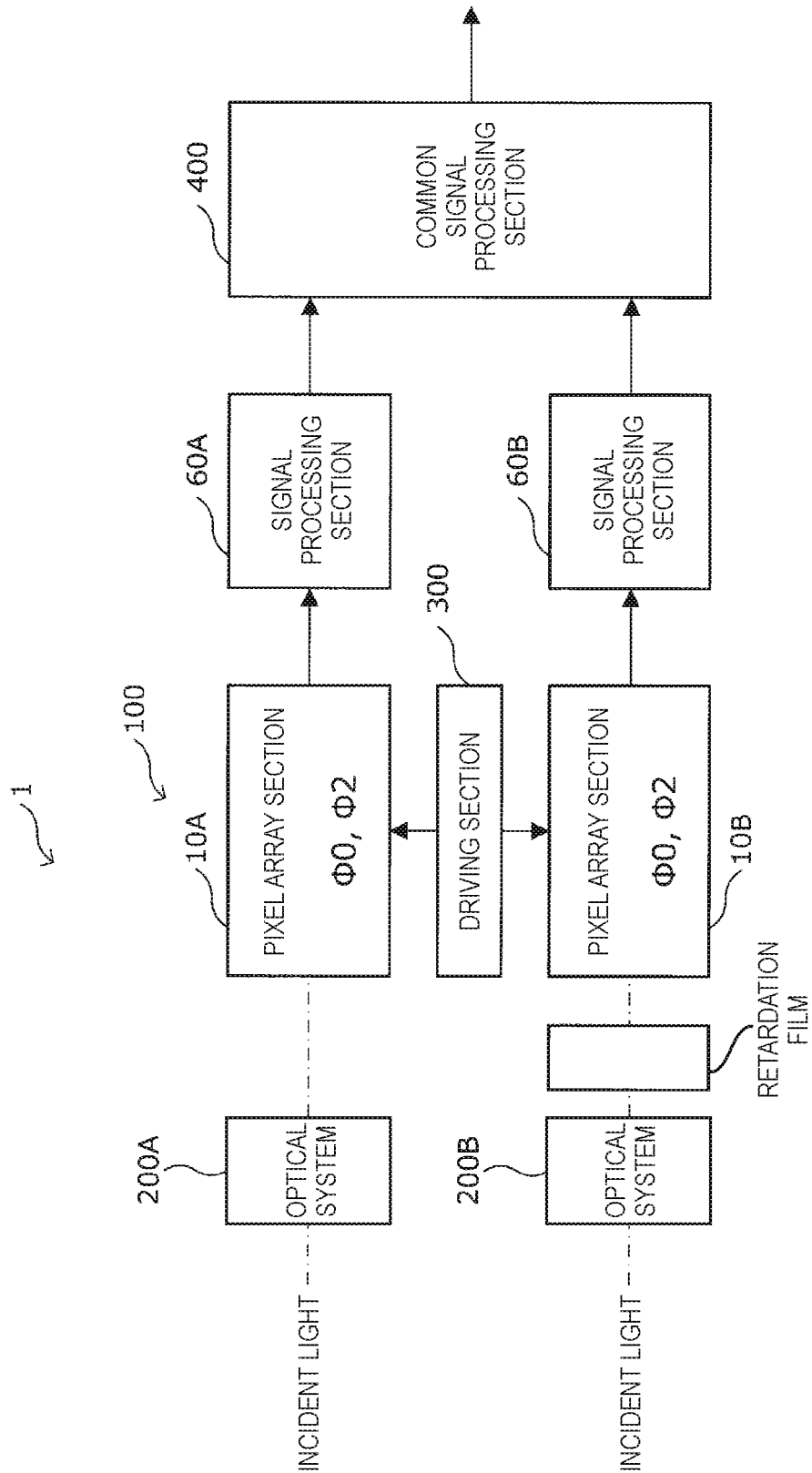

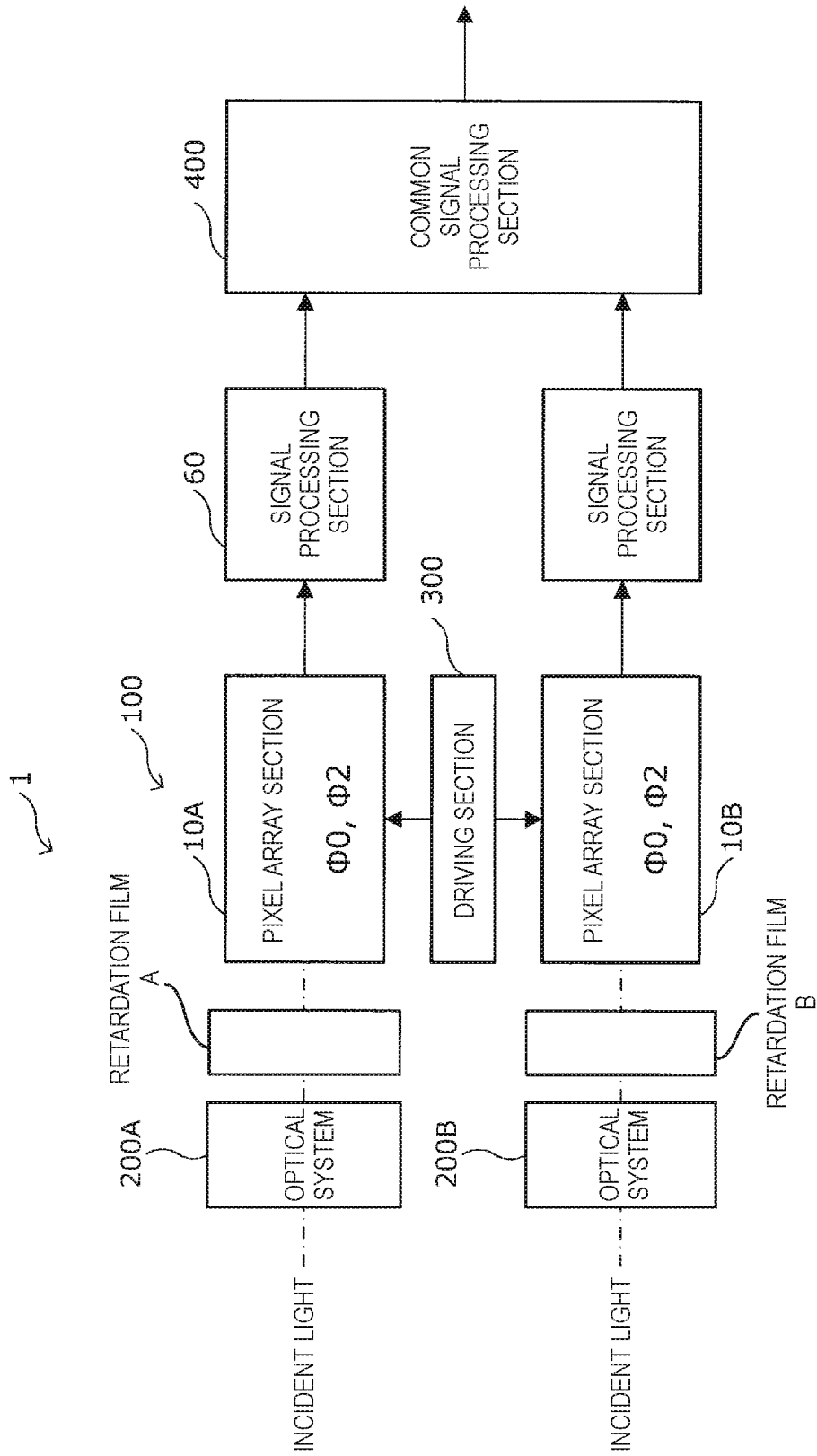

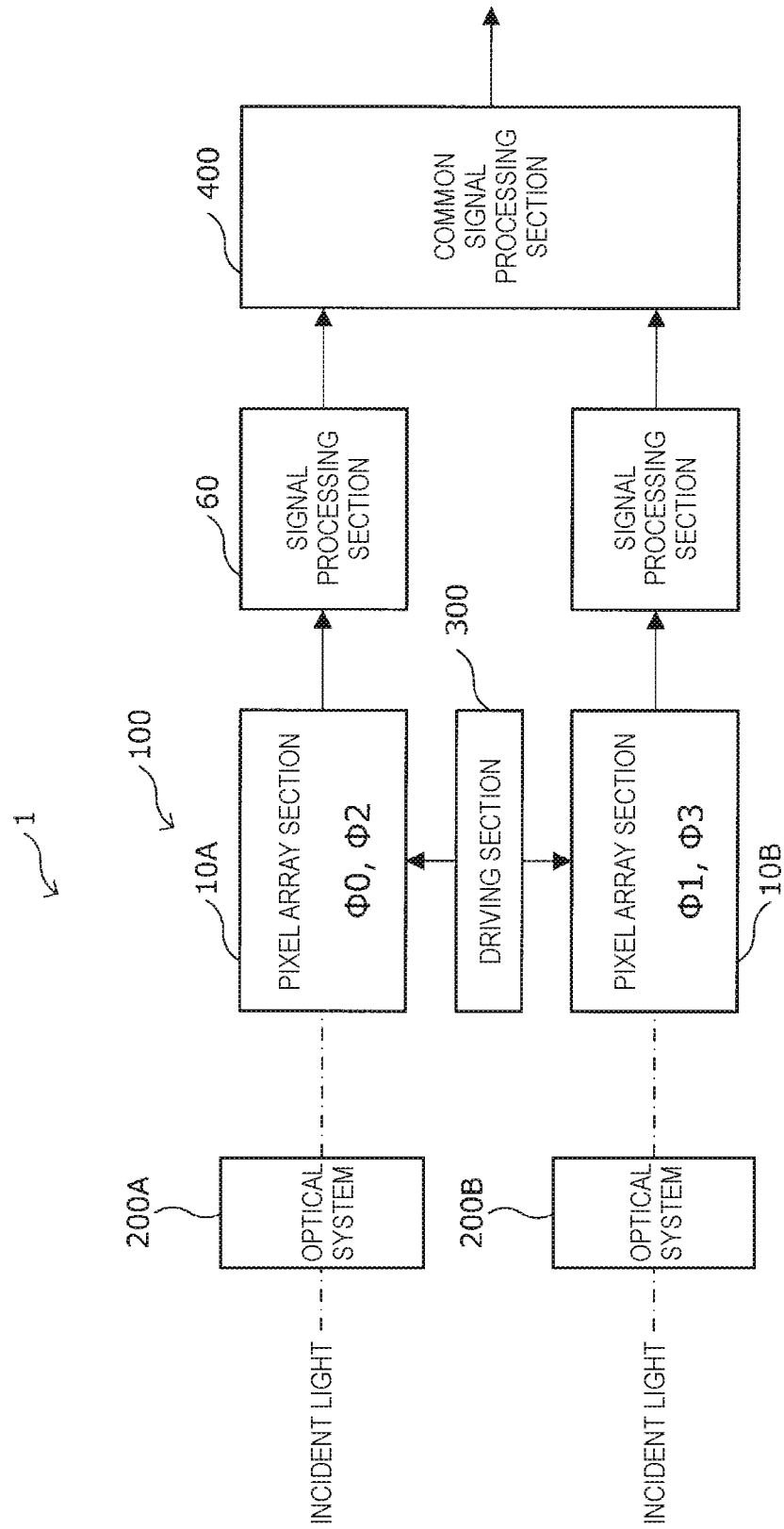

SOLID-STATE IMAGING ELEMENT, IMAGING DEVICE, AND METHOD FOR MANUFACTURING SOLID-STATE IMAGING ELEMENT

CROSS REFERENCE TO RELATED APPLICATIONS

This application is a U.S. National Phase of International Patent Application No. PCT/JP2016/078614 filed on Sep. 28, 2016, which claims priority benefit of Japanese Patent Application No. JP 2015-238216 filed in the Japan Patent Office on Dec. 7, 2015. Each of the above-referenced applications is hereby incorporated herein by reference in its entirety.

TECHNICAL FIELD

The present disclosure relates to a solid-state imaging element, an imaging device, and a method for manufacturing a solid-state imaging element.

BACKGROUND ART

In general, a pixel of a solid-state imaging element does not have sensitivity to polarized light; and in a case where it is intended to acquire information regarding the polarization of a subject, it is required to place a prescribed polarizing filter in a stage prior to an optical system that guides light to the solid-state imaging element.

These days, a technology in which a polarizing element is placed on a light receiving element in a solid-state imaging element and thereby a pixel is provided with polarization sensitivity is proposed.

For example, Patent Literature 1 below proposes a technology in which a dielectric multiple-layer film that is for a light receiving element and that has different reflection or transmission characteristics between a TE wave and a TM wave is stacked on a pixel, and Patent Literature 2 below proposes a technology in which a wire grid polarizing element in which metal wires are arranged at an interval narrower than the wavelength of an electromagnetic wave that is intended to be detected is placed on a light receiving element.

CITATION LIST

Patent Literature

Patent Literature 1: JP 4974543B
Patent Literature 2: JP 2010-263158A

DISCLOSURE OF INVENTION

Technical Problem

However, in the technologies proposed in Patent Literature 1 and Patent Literature 2 above, although there is an advantage that a pixel having sensitivity in an arbitrary polarization direction can be designed, it is required to mount a special optical element on the light receiving element in order to detect polarized light. Further, in the technologies proposed in Patent Literature 1 and Patent Literature 2 above, the sensitivity is reduced by half to non-polarized incident light, due to the reflection or absorption of non-transmissive polarization components, etc.

Thus, in view of the circumstances mentioned above, the present disclosure proposes a solid-state imaging element, an imaging device, and a method for manufacturing a solid-state imaging element that are capable of providing a pixel with polarization sensitivity while suppressing the reduction in sensitivity to non-polarized incident light.

Solution to Problem

According to the present disclosure, there is provided a solid-state imaging element including: a light receiving element included in a plurality of pixels; and a groove section provided on surfaces of at least some of the pixels in the light receiving element and extended along a prescribed direction. Two or more directions including at least mutually orthogonal two directions exist as a direction in which the groove section is extended.

In addition, according to the present disclosure, there is provided an imaging device including at least: a solid-state imaging element including a light receiving element included in a plurality of pixels, and a groove section provided on surfaces of at least some of the pixels in the light receiving element and extended along a prescribed direction, in which two or more directions including at least mutually orthogonal two directions exist as a direction in which the groove section is extended; and an optical system configured to guide light to the solid-state imaging element.

In addition, according to the present disclosure, there is provided a method for manufacturing a solid-state imaging element, including: forming a groove section extended along a prescribed direction, on a surface of a matrix functioning as a light receiving element included in a plurality of pixels. Two or more directions including at least mutually orthogonal two directions are set as a direction in which the groove section is extended.

According to the present disclosure, a groove section extended along a prescribed direction is provided on a surface of a light receiving element of at least some of the pixels, and thereby sensitivity reduction can be suppressed even in a case where non-polarized incident light is incident. Further, in a case where polarized light is incident, the pixel provided with the groove section exhibits different pixel characteristics in accordance with the polarization direction of the incident light.

Advantageous Effects of Invention

As described above, according to the present disclosure, it becomes possible to provide a pixel with polarization sensitivity while suppressing the reduction in sensitivity to non-polarized incident light.

Note that the effects described above are not necessarily limitative. With or in the place of the above effects, there may be achieved any one of the effects described in this specification or other effects that may be grasped from this specification.

BRIEF DESCRIPTION OF DRAWINGS

FIG. 11A is an explanatory diagram schematically showing an arrangement state of groove sections in a pixel array section of a solid-state imaging element according to the embodiment.

FIG. 11C is an explanatory diagram schematically showing an arrangement state of groove sections in a pixel array section of a solid-state imaging element according to the embodiment.

FIG. 11D is an explanatory diagram schematically showing an arrangement state of groove sections in a pixel array section of a solid-state imaging element according to the embodiment.

FIG. 14A is an explanatory diagram schematically showing a configuration of an imaging device including a solid-state imaging element according to the embodiment.

FIG. 14B is an explanatory diagram schematically showing a configuration of an imaging device including a solid-state imaging element according to the embodiment.

FIG. 14C is an explanatory diagram schematically showing a configuration of an imaging device including a solid-state imaging element according to the embodiment.

FIG. 14D is an explanatory diagram schematically showing a configuration of an imaging device including a solid-state imaging element according to the embodiment.

FIG. 14E is an explanatory diagram schematically showing a configuration of an imaging device including a solid-state imaging element according to the embodiment.

MODE(S) FOR CARRYING OUT THE INVENTION

Figure 1:
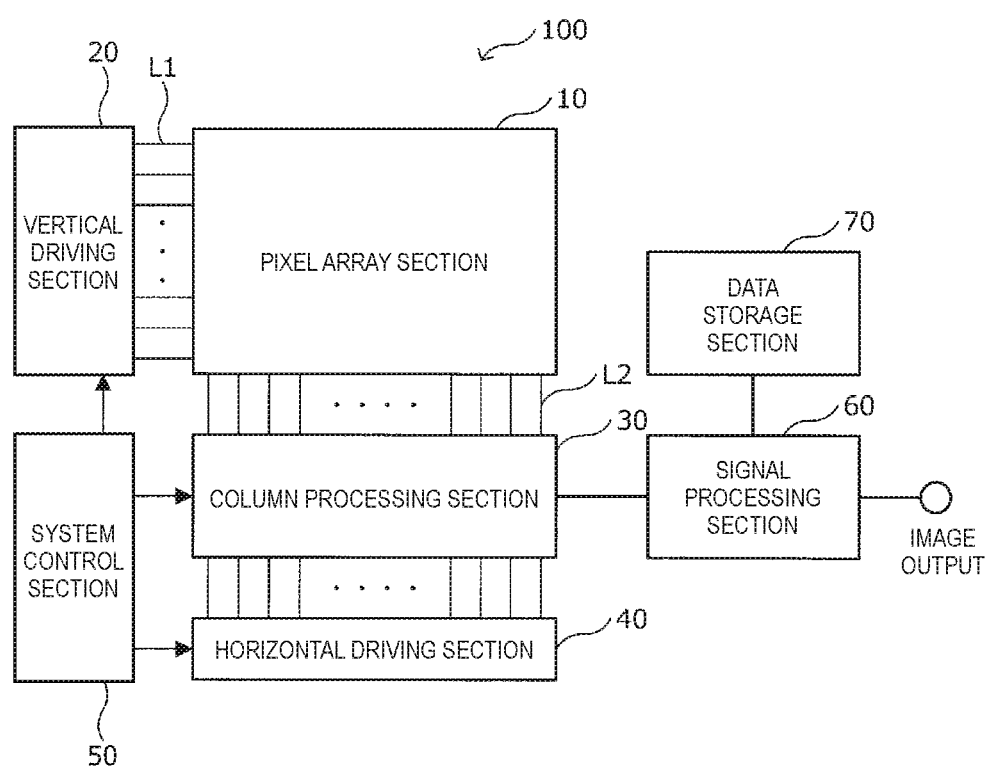
FIG. 1 is an explanatory diagram schematically showing an overall configuration of a solid-state imaging element according to an embodiment of the present disclosure.

Hereinafter, (a) preferred embodiment(s) of the present disclosure will be described in detail with reference to the appended drawings. Note that, in this specification and the appended drawings, structural elements that have substantially the same function and structure are denoted with the same reference numerals, and repeated explanation of these structural elements is omitted.

Note that, the description is given in the following order.

1. First Embodiment 1.1. With regard to overall configuration of solid-state imaging element
1.2. With regard to equivalent circuit diagram of unit pixel
1.3. With regard to structure of pixel array section
1.4. With regard to processing of calculating polarization parameters
1.5. With regard to configurations of imaging devices
1.6. With regard to flow of image output processing in imaging device
1.7. With regard to method for manufacturing solid-state imaging element
2. Conclusions
3. Example First Embodiment <With Regard to Overall Configuration of Solid-State Imaging Element>

First, the overall configuration of a solid-state imaging element according to a first embodiment of the present disclosure is briefly described with reference to FIG. 1. FIG. 1 is an explanatory diagram schematically showing the overall configuration of a solid-state imaging element according to the present embodiment. Note that, in the following, a description is given taking a four-transistor back-side illumination image sensor as an example of the solid-state imaging element.

A solid-state imaging element 100 according to the present embodiment includes, as schematically shown in FIG. 1, a pixel array section 10, a vertical driving section 20, a column processing section 30, a horizontal driving section 40, and a system control section 50. Note that the pixel array section 10, the vertical driving section 20, the column processing section 30, the horizontal driving section 40, and the system control section 50 are formed on one not-illustrated semiconductor substrate (chip), for example.

Further, the solid-state imaging element 100 preferably further includes a signal processing section 60 and a data storage section 70. Note that the signal processing section 60 and the data storage section 70 may include, for example, an external signal processing section that is provided on a substrate different from the substrate of the solid-state imaging element 100 and that performs processing with a digital signal processor (DSP) and a software application. Further, the signal processing section 60 and the data storage section 70 may be mounted on, for example, the same semiconductor substrate as the semiconductor substrate on which the pixel array section 10 etc. are formed.

The pixel array section 10 includes a plurality of unit pixels that are two-dimensionally arranged in a matrix configuration (hereinafter, occasionally referred to as simply "pixels"). Further, a photoelectric conversion element (in the present embodiment, a photodiode) that generates an amount of light charge corresponding to the amount of incident light (hereinafter, referred to as simply "charge") and accumulates the charge in the inside is provided in each pixel.

The pixel array section 10 further includes a pixel driving line L1 formed along the row direction (the left and right direction in FIG. 1) for each row of pixels that are two-dimensionally arranged in a matrix configuration and a vertical signal line L2 formed along the column direction (the up and down direction in FIG. 1) for each column. Note that each pixel driving line L1 is connected to the pixels of the corresponding row, and each vertical signal line L2 is connected to the pixels of the corresponding column.

Further, one end of a pixel driving line L1 is connected to an output end of the vertical driving section 20, which end is of the row corresponding to that pixel driving line L1, and one end of a vertical signal line L2 is connected to an input end of the column processing section 30, which end is of the column corresponding to that vertical signal line L2. Note that, although in FIG. 1 the pixel driving line L1 of each row is shown as one signal line for simpler description, usually a plurality of signal lines that drive a plurality of transistors included in the pixel, respectively, are provided for each row, as described later.

The vertical driving section 20 includes, for example, circuit elements such as a shift register and an address decoder. The vertical driving section 20 outputs various driving signals to each pixel of the pixel array section 10 to drive each pixel, and reads out a signal from each pixel.

For each column of pixels of the pixel array section 10, the column processing section 30 performs prescribed signal processing on a pixel signal that is outputted from a prescribed pixel of a selected row via the vertical signal line L2, and temporarily holds the pixel signal after signal processing.

Specifically, the column processing section 30 performs, as signal processing, at least denoising processing such as correlated double sampling (CDS) processing, for example. By CDS processing in the column processing section 30, for example, reset noise and pixel-unique fixed pattern noise caused by a threshold variation of an amplification transistor etc. can be removed. Note that it is also possible to employ a configuration in which the column processing section 30 is provided with, for example, an analog-to-digital (A/D) conversion function as well as the denoising function described above and a digital signal is outputted.

The horizontal driving section 40 includes, for example, circuit elements such as a shift register and an address decoder. The horizontal driving section 40 sequentially and selectively scans unit circuits (not illustrated) each provided for each column of the column processing section 30. By the selective scanning of the horizontal driving section 40, pixel signals that are signal-processed in the unit circuits of the column processing section 30 are sequentially outputted to the signal processing section 60.

The system control section 50 includes, for example, a timing generator that generates timing signals of various operations of the solid-state imaging element 100, or the like. Then, various timing signals generated in the system control section 50 are supplied to the vertical driving section 20, the column processing section 30, and the horizontal driving section 40, and the driving of each part is controlled on the basis of the timing signals.

The signal processing section 60 performs, for example, various pieces of signal processing such as addition processing on a pixel signal outputted from the column processing section 30. Further, the data storage section 70 temporarily stores data that are necessary when performing prescribed signal processing in the signal processing section 60.

Hereinabove, the overall configuration of the solid-state imaging element 100 according to the present embodiment is briefly described with reference to FIG. 1.

<With Regard to Equivalent Circuit Diagram of Unit Pixel>

Next, an equivalent circuit diagram of a unit pixel in a four-transistor image sensor like that shown in FIG. 1 is briefly described with reference to FIG. 2.

A pixel usually includes one photodiode 1001 (photoelectric conversion element), various active elements including MOS transistors provided for the one photodiode 1001, and a floating diffusion (FD) region 1011. In the example shown in FIG. 2, the pixel includes, as various active elements, a transfer transistor 1003, an amplification transistor 1005, a reset transistor 1007, and a selection transistor 1009. Note that FIG. 2 shows an example in which each of the various transistors is formed using a MOS transistor of an n-type carrier polarity.

Figure 2:
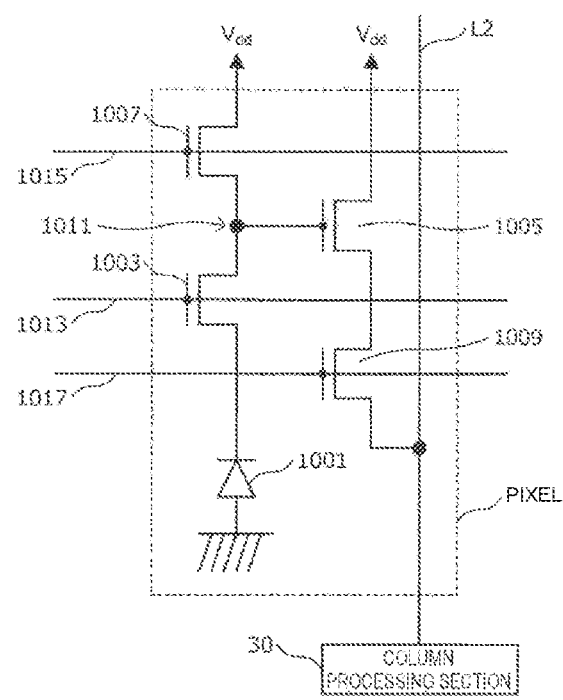
FIG. 2 is an equivalent circuit diagram of a unit pixel in a solid-state imaging element according to the embodiment.

Further, in the example shown in FIG. 2, for one pixel, three signal interconnections of a transfer interconnection 1013, a reset interconnection 1015, and a selection interconnection 1017 (the pixel driving lines L1) are provided in the row direction (the left and right direction in FIG. 2), and the vertical signal line L2 is provided in the column direction (the up and down direction in FIG. 2). Note that, although not illustrated in FIG. 2, also a two-dimensional interconnection used as a light blocking film is provided in a pixel boundary portion and a black level detection pixel among the pixels 10.

The photodiode 1001 converts incident light to an amount of charge corresponding to the amount of incident light (herein, electrons) (that is, incident light is photoelectrically converted to a charge). Note that the anode of the photodiode 1001 is grounded as shown in FIG. 2.

The transfer transistor 1003 is provided between the cathode of the photodiode 1001 and the FD region 1011. When a high-level signal is inputted to the gate of the transfer transistor 1003 from the vertical driving section L1 via the transfer interconnection 1013, the transfer transistor 1003 enters the ON state, and transfers a charge (electrons) generated by photoelectric conversion in the photodiode 1001 to the FD region 1011. Note that the charge transferred to the FD region 1011 is converted to a voltage (electric potential) in the FD region 1011.

The gate of the amplification transistor 1005 is connected to the FD region 1011. Further, the drain of the amplification transistor 1005 is connected to a terminal for supplying a power supply voltage $V_{dd}$, and the source of the amplification transistor 1005 is connected to the vertical signal line L2 via the selection transistor 1009. The amplification transistor 1005 amplifies the electric potential (the voltage signal) of the FD region 1011, and outputs the amplified signal as a light accumulation signal (a pixel signal) to the selection transistor 1009.

The reset transistor 1007 is provided between a terminal for supplying the power supply voltage $V_{dd}$ and the FD region 1011. When a high-level signal is inputted to the gate of the reset transistor 1007 from the vertical driving section 20 via the reset interconnection 1015, the reset transistor 1007 enters the ON state, and resets the electric potential of the FD region 1011 to the power supply voltage $V_{dd}$.

The selection transistor 1009 is provided between the amplification transistor 1005 and the vertical signal line L2. When a high-level signal is inputted to the gate of the selection transistor 1009 from the vertical driving section 20 via the selection interconnection 1017, the selection transistor 1009 enters the ON state, and outputs a voltage signal amplified in the amplification transistor 1005 to the vertical signal line L2. That is, in a case where the solid-state imaging element 100 is a four-transistor image sensor, the switching between selection and non-selection of a pixel is controlled by the selection transistor 1009. Note that the voltage signal of each pixel outputted to the vertical signal line L2 is transferred to the column processing section 30.

Hereinabove, an equivalent circuit diagram of a unit pixel in a four-transistor image sensor is briefly described with reference to FIG. 2.

<With Regard to Structure of Pixel Array Section>

Next, the structure of the pixel array section 10 included in the solid-state imaging element 100 according to the present embodiment is described in detail with reference to FIGS. 3, 4, 5, 6A, 6B, 7, 8, 9, 10, 11A, 11B, 11C, 11D, 11E, 11F, 11G, 11H and 12.

Figure 3:
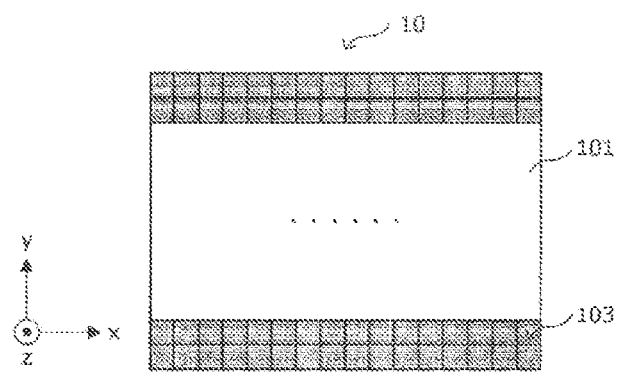
FIG. 3 is an explanatory diagram schematically showing a pixel array section of a solid-state imaging element according to the embodiment.
Figure 4:
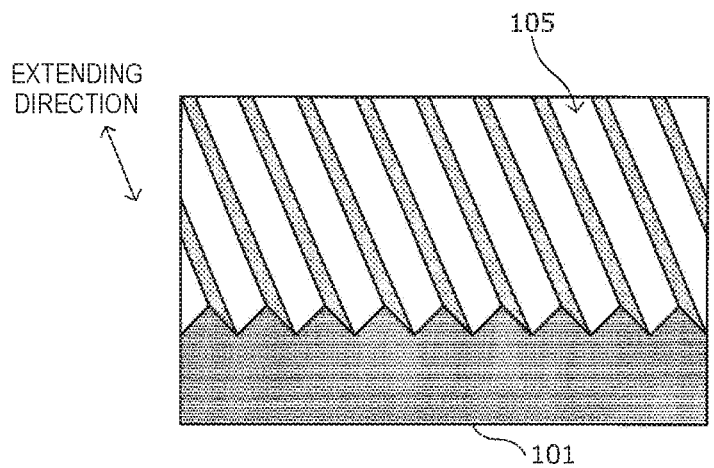
FIG. 4 is an explanatory diagram for describing groove sections provided in a pixel array section of a solid-state imaging element according to the embodiment.
Figure 5:
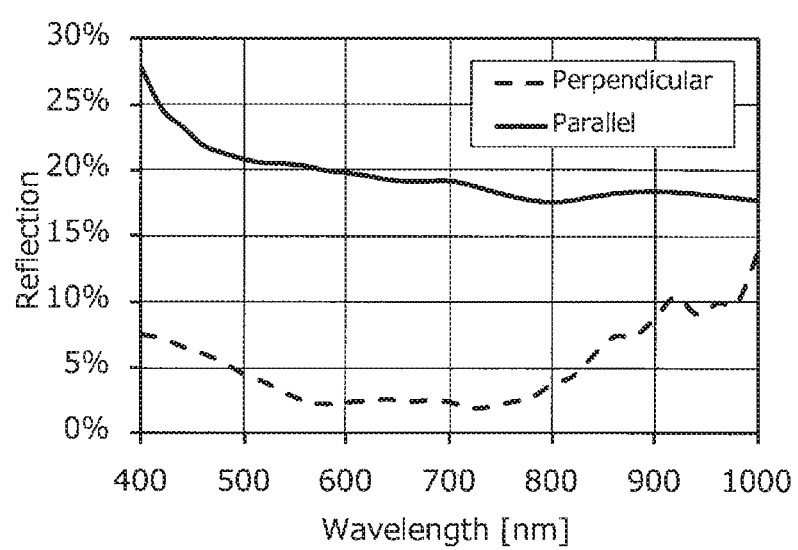
FIG. 5 is a graph for describing groove sections provided in a pixel array section of a solid-state imaging element according to the embodiment.
Figure 6A:
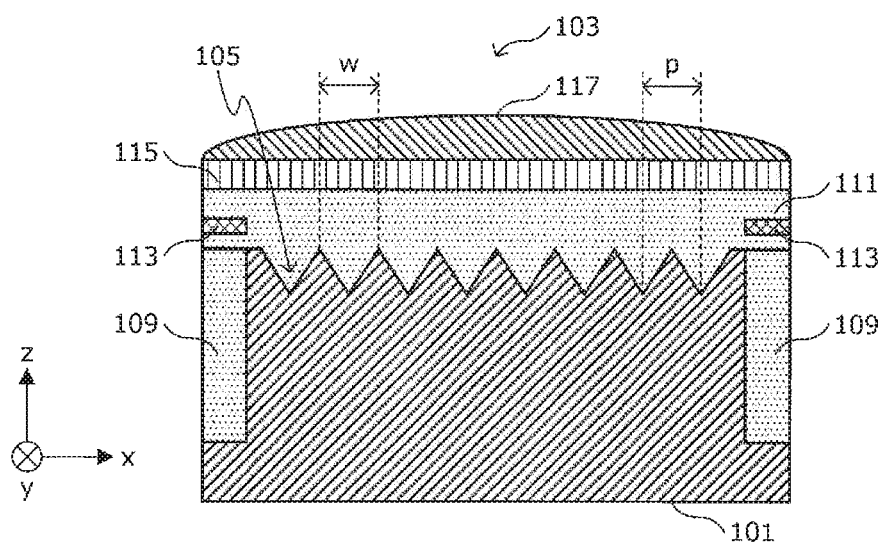
FIG. 6A is an explanatory diagram schematically showing a structure of a pixel array section of a solid-state imaging element according to the embodiment.
Figure 6B:
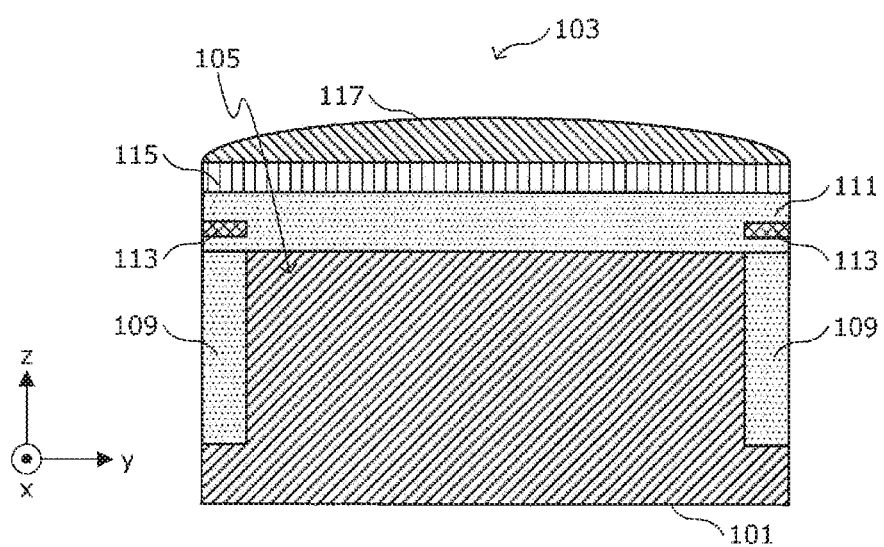
FIG. 6B is an explanatory diagram schematically showing a structure of a pixel array section of a solid-state imaging element according to the embodiment.

FIG. 3 is an explanatory diagram schematically showing a pixel array section according to the present embodiment. FIG. 4 and FIG. 5 are an explanatory diagram and a graph, respectively, for describing groove sections provided in a pixel array section according to the present embodiment. FIG. 6A and FIG. 6B are explanatory diagrams schematically showing the structure of a pixel array section according to the present embodiment. FIGS. 7, 8, 9, and 10 are explanatory diagrams schematically showing the structures of pixel array sections according to the present embodiment. FIGS. 11A, 11B, 11C, 11D, and 11E are explanatory diagrams schematically showing arrangement states of groove sections in a pixel array section according to the present embodiment. FIG. 12 is an explanatory diagram schematically showing the structure of a pixel array section according to the present embodiment.

As schematically shown in FIG. 3, the pixel array section 10 of the solid-state imaging element 100 according to the present embodiment is formed using a light receiving element 101, and a plurality of pixels 103 two-dimensionally arranged in a matrix configuration (array configuration) are provided in the light receiving element 101. If, as shown in FIG. 3, the light receiving element plane of the light receiving element 101 is defined as an xy plane for the sake of convenience and the height direction of the pixel array section 10 is defined as a z-axis positive direction for the sake of convenience, the plurality of pixels 103 are two-dimensionally arranged on the xy plane.

The present inventors conducted extensive studies on a method for providing a pixel with polarization sensitivity while suppressing the reduction in sensitivity to non-polarized incident light, and consequently have thought up providing sensitivity to polarized light to the light receiving element itself, instead of performing mounting above the light receiving element as disclosed in Patent Literature 1 and Patent Literature 2 above. The present inventors conducted further studies on a technology for it, and consequently have thought up, as schematically shown in FIG. 4, providing one-dimensional groove sections 105 extended along a prescribed extending direction (in FIG. 2, groove sections each having a cross section of a substantially V-like shape), on a surface of a pixel of the light receiving element 101.

It is presumed that, by providing one-dimensional groove sections 105 like those shown in FIG. 4 on a surface of the light receiving element 101, it becomes possible to provide the pixel 103 with different reflection characteristics and absorption characteristics between a polarization component parallel to the extending direction of the groove section 105 and a polarization component orthogonal to the extending direction of the groove section 105.

A simulation was performed for a case where an incident electromagnetic wave polarized in a certain direction is incident on groove sections 105 like those shown in FIG. 4, using a known electromagnetic field analysis application. In this event, it is presumed that the period of groove sections 105 like those shown in FIG. 4 (that is, the spacing to an adjacent groove section 105) and the width of the groove section 105 are preferably of an order approximately equal to the wavelength; thus, in the present simulation, these dimensions were set to 400 nm, and an analysis was performed.

The analysis results shown in FIG. 5 show reflection characteristics in a case where an incident electromagnetic wave is incident parallel to the extending direction of the groove section 105 (corresponding to the thick line in FIG. 5) and in a case where an incident electromagnetic wave is incident orthogonal to the extending direction of the groove section 105 (corresponding to the broken line in FIG. 5). In FIG. 5, the horizontal axis represents the wavelength (unit: nm), and the vertical axis represents the reflectance (unit: %).

As is clear from the results shown in FIG. 5, it can be seen that, in the visible light region to the near-infrared light region, relatively large reflection characteristics have been obtained for an incident electromagnetic wave oscillating in a plane parallel to the extending direction of the groove section 105.

From the results shown in FIG. 5, it has been revealed that, by providing one-dimensional groove sections 105 on the surface of the light receiving element 101, it becomes possible to provide the pixel 103 with different reflection characteristics and absorption characteristics between a polarization component parallel to the extending direction of the groove section 105 and a polarization component orthogonal to the extending direction of the groove section 105.

Here, in a wire grid polarizing element like that disclosed in Patent Literature 2 above, in a case where non-polarized light is incident, the intensity of the non-polarized light is reduced by half due to transmission through the wire grid polarizing element. However, in the light receiving element 101 including groove sections 105 according to the present embodiment, the groove sections 105 are provided directly on the surface of the light receiving element 101; thereby, if non-polarized light is incident, the groove sections 105 exhibit common response characteristics for non-polarized light regardless of the polarization direction. As a result, a reduction in intensity like in a wire grid polarizing element does not occur, and the light receiving element 101 according to the present embodiment responds as an ordinary pixel to non-polarized light. Thereby, a pixel that responds as an ordinary pixel for non-polarized light and furthermore exhibits different sensitivity characteristics for polarized light can be obtained.

[Detailed Configuration Example of Pixel Array Section]

The structure of the pixel 103 included in the pixel array section 10 according to the present embodiment will now be described in more detail with reference to FIG. 6A and FIG. 6B. In the following description, it is assumed that the groove section 105 is extended substantially parallel to the y-axis direction shown in the drawing.

The pixel 103 of the pixel array section 10 according to the present embodiment includes, as shown in FIG. 6A and FIG. 6B, the light receiving element 101 functioning as a light absorbing layer, and groove sections 105 each having a cross section of a substantially V-like shape and extended along the y-axis direction are provided on a surface of the light receiving element 101 (the surface in the z-axis positive direction). Further, in the pixel 103 according to the present embodiment, it is preferable that, for the purpose of preventing color mixing between mutually adjacent pixels 103, a trench structure 109 that is an element isolation structure be formed near the end in the x-axis direction and near the end in the y-axis direction of the pixel 103.

A flattening film 111 is provided above the groove section 105 for the purpose of flattening the surface of the light receiving element 101. Further, it is preferable that, in order to prevent color mixing between mutually adjacent pixels 103, a light blocking section 113 be provided above the trench structure 109, as shown in FIG. 6A and FIG. 6B.

A wavelength selection filter 115 for selecting the wavelength of light that forms an image on the light receiving element 101 is provided on the flattening film 111, and a light collecting structure element (on-chip-lens) 117 is provided on the wavelength selection filter 115.

The light receiving element 101 is a part functioning as the photodiode 1001 in the equivalent circuit diagram shown in FIG. 2. The light receiving element 101 may be formed using known semiconductors including compound semiconductors. Such a semiconductor is not particularly limited; in general, single-crystal silicon having a thickness (height in the z-axis direction) of approximately 3 μm is used in many cases.

The groove section 105 mentioned above is formed on the surface of the light receiving element 101 included in one pixel 103.

Here, the width of the groove section 105 (w in FIG. 6A) and the interval (that is, period (pitch)) p between mutually adjacent groove sections 105 are preferably of an order approximately equal to the wavelength of light focused on, as mentioned above. Hence, in a case where the solid-state imaging element 100 according to the present embodiment is used as a sensor having sensitivity in the ultraviolet light region, the visible light region, and the infrared light region, each of the width w and the interval p is preferably in the range of 100 nm to 1000 nm. Further, in a case where the solid-state imaging element 100 according to the present embodiment is used as a sensor having sensitivity in the visible light region, each of the width w and the interval p is preferably in the range of 200 nm to 500 nm, and is more preferably set in the range of approximately 350 nm±100 nm.

Further, each of the width w and the interval p of a groove section 105 like that shown in FIG. 6A is preferably a size of one over an integer of the pixel size. In this event, the width w and the interval p of the groove section 105 are preferably set so that the number of groove sections 105 in one pixel is approximately 3 to 10, for example.

By designing the width w and the interval p of the groove section 105 in the above manner, it becomes possible to obtain a solid-state imaging element 100 having more excellent sensitivity characteristics.

Figure 7:
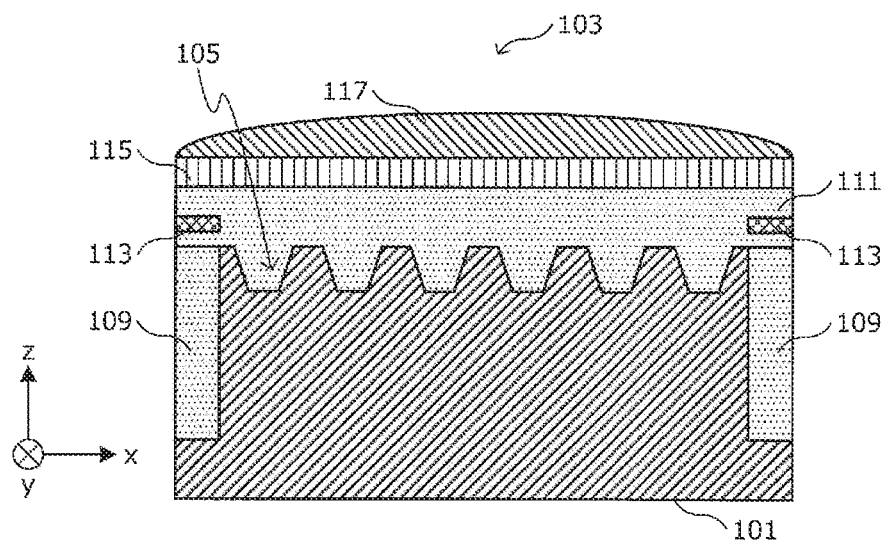
FIG. 7 is an explanatory diagram schematically showing a structure of a pixel array section of a solid-state imaging element according to the embodiment.

Note that the cross-sectional shape of the groove section 105 is not limited to a substantially V-like shape like that shown in FIG. 6A, and may be a tapered shape like that shown in FIG. 7. Further, in the groove section 105 according to the present embodiment, excellent polarization characteristics can be obtained if, as shown in FIG. 6A and FIG. 7, there is an inclined surface in which the width w decreases with transition from the surface of the light receiving element 101 toward the z-axis negative direction side; thus, the bottom surface of the groove section 105 may be flat like a tapered shape or may be a curved surface having a curvature different from the curvature of the inclined surface.

Further, the depth of the groove section 105 is not particularly limited, and may be any depth as long as there is an inclined surface based on a cross section of a substantially V-like shape or a tapered shape like that mentioned above. The maximum depth of the groove section 105 is not particularly prescribed, either; but such a maximum depth is usually determined in accordance with the characteristics of the material used as the light receiving element 101.

For example, in a case where single-crystal silicon is used as the light receiving element 101, in many cases the surface of the light receiving element 101 is formed using the Si (100) plane, and at least a part of the groove section 105 is usually formed by cutting out the Si (111) plane from the Si (100) plane. Hence, in a case of using single-crystal silicon, the angle of the inclined surface is approximately 54.7 degrees, which is the angle between the Si (100) plane and the Si (111) plane, and the depth formed in accordance with this angle serves as the maximum depth of the groove section 105 in the case of using single-crystal silicon.

Figure 8:
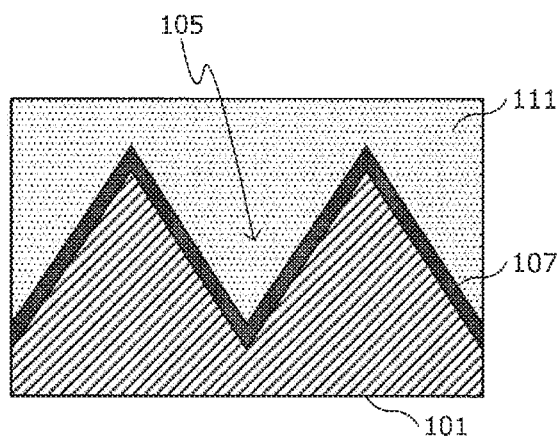
FIG. 8 is an explanatory diagram schematically showing a structure of a pixel array section of a solid-state imaging element according to the embodiment.

Further, in the solid-state imaging element 100 according to the present embodiment, it is preferable that, as schematically shown in the enlarged view of FIG. 8, a dielectric layer 107 containing a high-permittivity (high-k) material as a main component be provided on the surface of the groove section 105. By providing such a dielectric layer 107, it becomes possible to pin the Fermi level of the semiconductor material used as the light receiving element 101, and it also becomes possible to make gentle the degree of change in refractive index between the flattening film 111 described later and the light receiving element 101. Note that the high-permittivity (high-k) material used for the dielectric layer 107 is not particularly limited, and a known high-permittivity material may be used. Examples of such a high-permittivity material include various metal oxides such as $HfO_2$, which is a hafnium-based oxide, tantalum oxide ($Ta_2O_5$), aluminum oxide ($Al_2O_3$), and titanium oxide ($TiO_2$).

The pixel 103 provided with groove sections 105 like those described above exhibits different reflection characteristics or absorption characteristics for incident light polarized in a specific direction.

Returning to FIG. 6A and FIG. 6B again, the trench structure 109 provided in the pixel 103 according to the present embodiment will now described.

As mentioned above, in the pixel 103 according to the present embodiment, it is preferable that, for the purpose of preventing color mixing between mutually adjacent pixels 103, the trench structure 109 that is an element isolation structure be formed near the end in the x-axis direction and near the end in the y-axis direction of the pixel 103.

Such a trench structure 109 may be a trench structure containing a dielectric material as a main component. Here, examples of the dielectric material used for the trench structure 109 include a dielectric material that reflects or absorbs visible light and near-infrared light, and a high-permittivity (high-k) material. The dielectric material that reflects or absorbs visible light and near-infrared light is not particularly limited; for example, a silicon oxide ($SiO_2$), a silicon oxynitride (SiON), a silicon nitride (SiN), or the like may be used. Further, as the high-permittivity (high-k) material, various metal oxides such as $HfO_2$, which is a hafnium-based oxide, tantalum oxide ($Ta_2O_5$), aluminum oxide ($Al_2O_3$), and titanium oxide ($TiO_2$) may be used.

Figure 9:
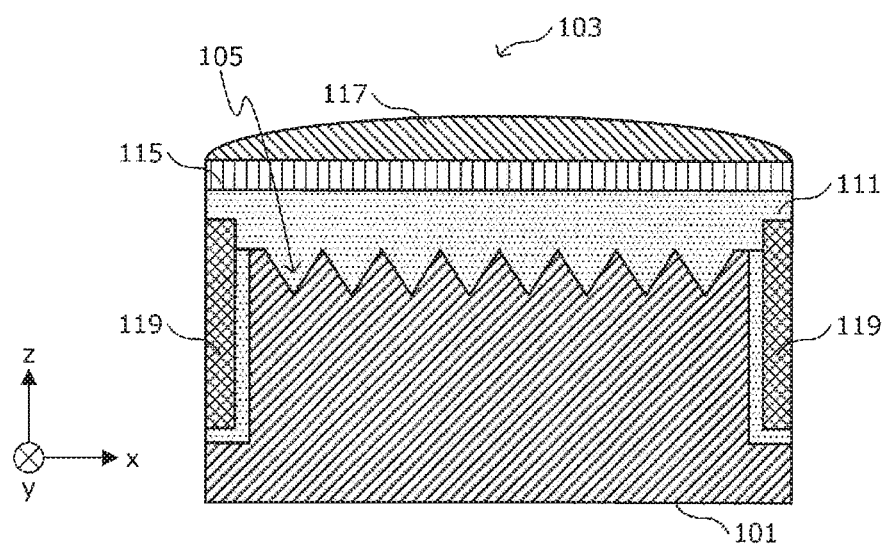
FIG. 9 is an explanatory diagram schematically showing a structure of a pixel array section of a solid-state imaging element according to the embodiment.

Further, as schematically shown in FIG. 9, a metal trench structure 119 containing, as a main component, a metal that reflects or absorbs visible light and near-infrared light may be provided as the trench structure 109 according to the present embodiment. Such a metal trench structure 119 is obtained by filling a concave section formed as a trench structure with a metal that reflects or absorbs visible light and near-infrared light. Such a metal that reflects or absorbs visible light and near-infrared light is not particularly limited, and examples include at least one metal selected from the group consisting of tungsten, titanium, copper, and aluminum, and alloys of these.

By providing a trench structure 109 like that described above, light diffracted in the interior of the light receiving element 101 included in the unit pixel 103 can be prevented from being transmitted to an adjacent pixel 103, and as a result it becomes possible to prevent crosstalk between adjacent pixels.

Returning to FIG. 6A and FIG. 6B again, the flattening film 111 provided in the pixel 103 according to the present embodiment will now be described.

In the pixel 103 according to the present embodiment, the flattening film 111 is provided on the light receiving element 101 provided with the groove section 105. By such a flattening film 111 being formed, the contact between the light receiving element 101 and the wavelength selection filter 115 described later is improved. Such a flattening film 111 may be formed using a dielectric material transparent to light of a wavelength region focused on. Such a dielectric material is not particularly limited; for example, a silicon oxide ($SiO_2$), a silicon nitride (SiN), or the like may be used.

The wavelength selection filter 115 for selecting the wavelength of light that forms an image on the light receiving element 101 is provided on such a flattening film 111. Such a wavelength selection filter 115 is not particularly limited, and may be formed using a known material that, in accordance with a wavelength region being focused on that is intended to form an image on the pixel 103, transmits light of such a wavelength region and reflects light of other wavelength regions.

The light collecting structure element (on-chip-lens) 117 for causing light incident on the pixel 103 to appropriately form an image on the light receiving element 101 is provided on the wavelength selection filter 115. Although FIG. 6A and FIG. 6B show a case where such a light collecting structure element 117 has a convex lens shape, the shape of the light collecting structure element 117 is not particularly limited, and may have an arbitrary shape in accordance with desired light collection characteristics. Such a light collecting structure element 117 may be formed using an optical material having a desired refractive index.

Figure 10:
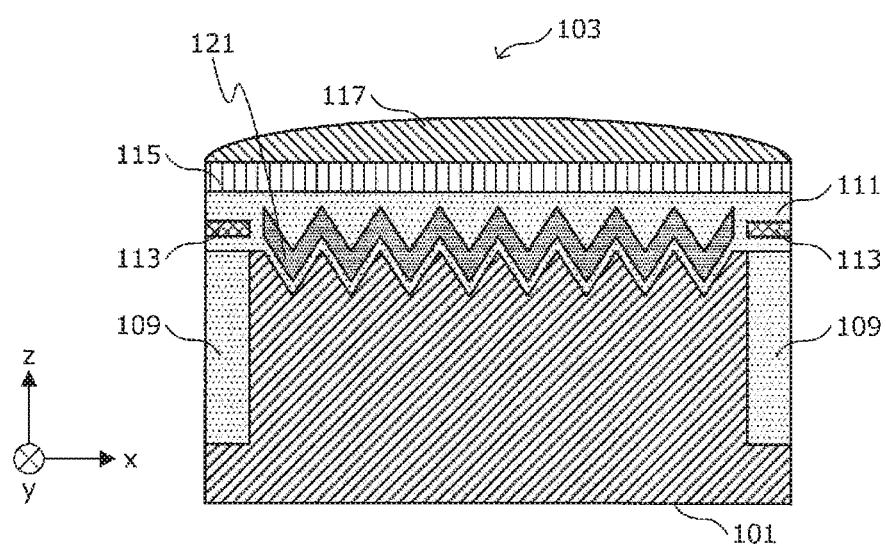
FIG. 10 is an explanatory diagram schematically showing a structure of a pixel array section of a solid-state imaging element according to the embodiment.

Note that, in the pixel 103 according to the present embodiment, it is preferable that, as schematically shown in FIG. 10, a dielectric multiple-layer film 121 having a shape similar to the shape of the groove section 105 be further provided on the groove section 105. In the example shown in FIG. 10, a groove section 105 having a cross section of a substantially V-like shape is provided, and accordingly the dielectric multiple-layer film 121 has a multiple-layer structure that has a structure pattern similar to cross-sections of substantially V-like shapes and in which a large number of parts each having a cross-section of a substantially V-like shape are linked along the x direction. The dielectric multiple-layer film 121 has a multiple-layer structure in which two or more kinds of dielectrics with different refractive indices are stacked, and each dielectric layer included in the dielectric multiple-layer film 121 preferably has an optical thickness of approximately $\lambda/4N_\lambda$. Here, $\lambda$ represents the center wavelength of light intended to be detected (in other words, light transmitted through the wavelength selection filter 115), and $N_\lambda$ represents the refractive index of the dielectric at such a wavelength. By providing such a dielectric multiple-layer film 121 on the light receiving element 101, it becomes possible to improve selection performance for a polarization component.

Hereinabove, the structure of the pixel 103 included in the pixel array section 10 according to the present embodiment is described in detail with reference to FIG. 3 to FIG. 10.

[With Regard to Arrangement States of Pixels]

Next, arrangement states of pixels in the pixel array section 10 according to the present embodiment are described with reference to FIGS. 11A, 11B, 11C, 11D, 11E, 11F, 11G, and 11H.

In the pixel array section 10 according to the present embodiment, a plurality of pixels each including a pixel 103 provided with one-dimensional groove sections 105 like those described above are two-dimensionally arranged. Here, in the pixel array section 10 according to the present embodiment, two or more directions including at least mutually orthogonal two directions exist as the direction in which the groove section 105 is extended.

Hereinbelow, arrangement states of pixels 103 provided with groove sections 105 are specifically described using examples, with reference to FIGS. 11A, 11B, 11C, 11D, 11E, 11F, 11G, and 11H. Note that the arrangement states shown in FIGS. 11A, 11B, 11C, 11D, 11E, 11F, 11G, and 11H are only examples, and arrangement states other than those shown in FIGS. 11A, 11B, 11C, 11D, 11E, 11F, 11G, and 11H may be created. Further, in FIGS. 11A, 11B, 11C, and 11D, the drawing on the left side schematically shows an arrangement state of wavelength selection filters 115 in pixels 103, and the drawing on the right side schematically shows a combination of extending directions of groove sections 105.

In the example of the arrangement state shown in FIG. 11A, wavelength selection filters 115 are arranged in what is called the Bayer arrangement. In such a Bayer arrangement, a pattern in which three kinds of wavelength selection filters 115 are arranged for 2×2 pixels may be possible. Here, the wavelength selection filter 115 has three kinds of C1, C2, and C3, and each has an optical feature that can selectively transmit a specific wavelength region of the visible light region to the near-the infrared light region. Specifically, in general, C1 is a color filter of a red system, C2, which is diagonally provided, is a color filter of a green system, and C3 is a color filter of a blue system, for example.

In this case, the combination of extending directions of groove sections 105 is, as shown in the drawing on the right side of FIG. 11A, a combination in which pixel groups each having one extending direction are arranged for one unit of 2×2 pixels. For example, a pixel group in which groove sections 105 are extended in the up and down direction in the drawing is provided in a pixel group in the upper left end section, and a pixel group in which groove sections 105 are extended in the left and right direction in the drawing is provided in each of the pixel groups placed immediately on the right side and the lower side of the pixel group mentioned above. Thus, by arranging pixel groups in a zigzag fashion in such a manner that the extending directions of groove sections 105 are mutually orthogonal, polarized light transmitted through each of the wavelength selection filters 115 of C1 to C3 has two kinds, i.e., one that forms an image on the pixel 103 in which the groove section 105 is extended in the up and down direction, and one that forms an image on the pixel 103 in which the groove section 105 is extended in the left and right direction.

Figure 11B:
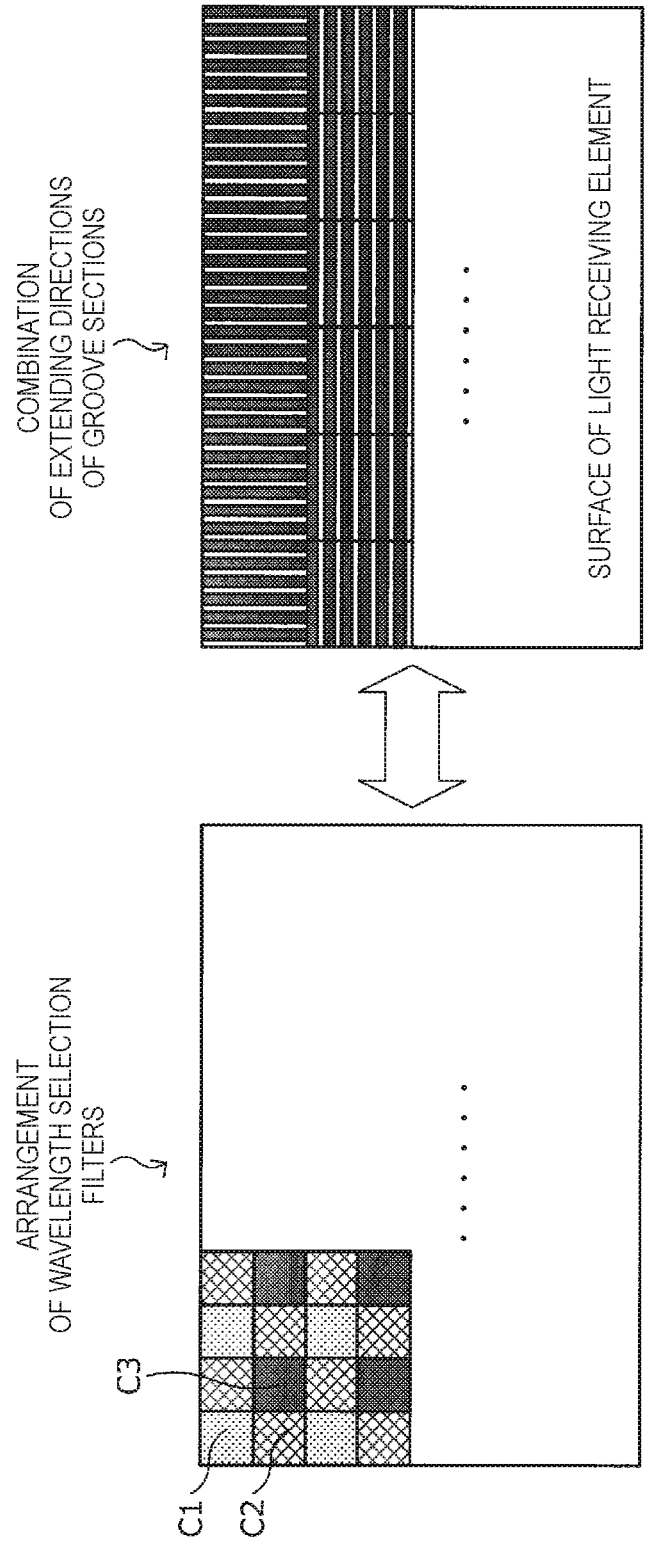
FIG. 11B is an explanatory diagram schematically showing an arrangement state of groove sections in a pixel array section of a solid-state imaging element according to the embodiment.
Figure 11E:
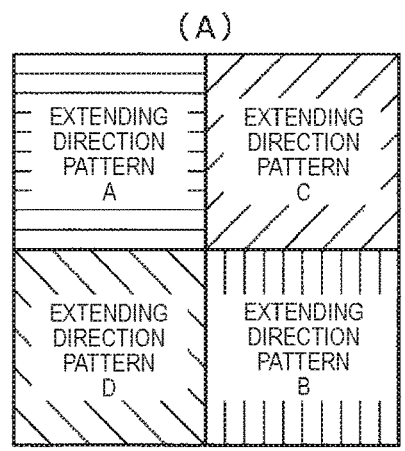
FIG. 11E is an explanatory diagram schematically showing an arrangement state of groove sections in a pixel array section of a solid-state imaging element according to the embodiment.
Figure 11F:
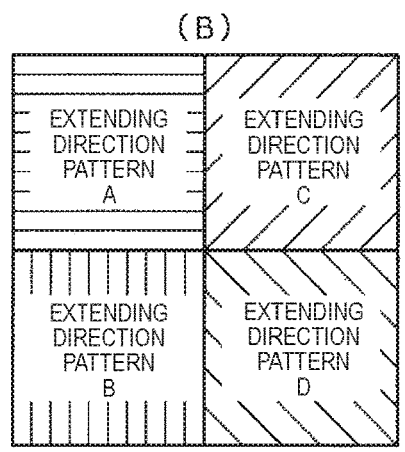
FIG. 11F is an explanatory diagram schematically showing an arrangement state of groove sections in a pixel array section of a solid-state imaging element according to the embodiment.
Figure 11G:
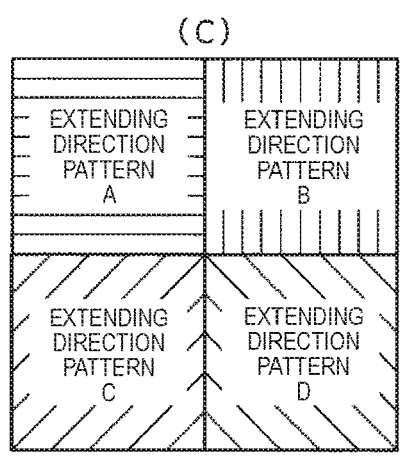
FIG. 11G is an explanatory diagram schematically showing an arrangement state of groove sections in a pixel array section of a solid-state imaging element according to the embodiment.
Figure 11H:
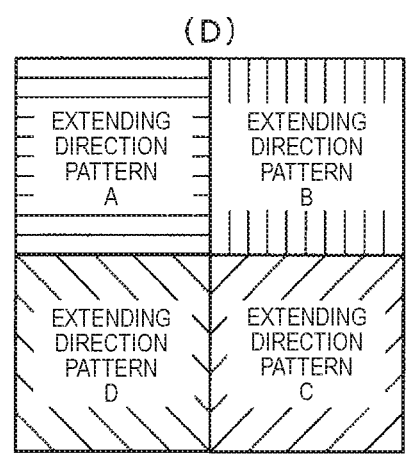
FIG. 11H is an explanatory diagram schematically showing an arrangement state of groove sections in a pixel array section of a solid-state imaging element according to the embodiment.
Figure 12:
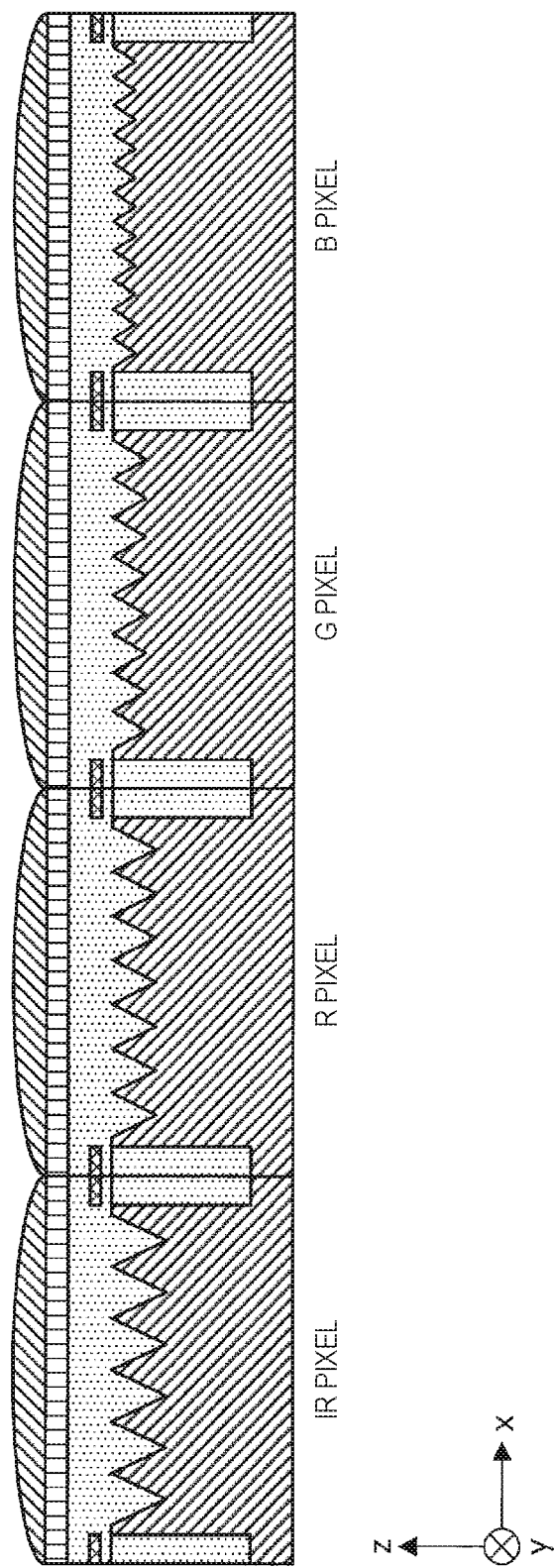
FIG. 12 is an explanatory diagram schematically showing a structure of a pixel array section of a solid-state imaging element according to the embodiment.

Further, the combination of extending directions of groove sections 105 may be, instead of a zigzag arrangement like that shown in FIG. 11A, the combination shown in FIG. 11B. In FIG. 11B, only pixel groups in which the extending direction of the groove section 105 is the up and down direction are arranged in the 1st row of the arrangement of pixel groups, and only pixel groups in which the extending direction of the groove section 105 is the left and right direction are arranged in the 2nd row; thus, only pixel groups in which the extending direction of the groove section 105 is the up and down direction are arranged in the rows in odd positions, and only pixel groups in which the extending direction of the groove section 105 is the left and right direction are arranged in the rows in even positions.

FIG. 11A and FIG. 11B show combination examples in a case where the groove section 105 is formed for all the pixels; however, as shown in FIG. 11C, the groove section 105 may be provided only for specific pixels. In the example shown in FIG. 11C, for wavelength selection filters 115 arranged in the Bayer arrangement, the groove section 105 is not provided for pixels corresponding to color filters of C1 and C3, and the groove section 105 is provided for pixels corresponding to color filters of C2 (in general, two color filters of a green system). In this event, the extending direction of the groove section 105 is set to the up and down direction for one color filter of C2, and the extending direction of the groove section 105 is set to the left and right direction for the other color filter of C2.

Further, the example shown in FIG. 11D shows a pattern in which, for wavelength selection filters 115 arranged in the Bayer arrangement, three kinds or four kinds of color filters are arranged for 2×2 pixels. Here, the color filter has four kinds of C1 to C4, and each has an optical feature that can selectively transmit a specific wavelength region of the visible light region to the near-the infrared light region. Specifically, for example, C1 is a color filter of a green system, C2 is a color filter of a red system, C3 is a color filter of a blue system, and C4 is a white filter that transmits the entire visible light region (or transmits a region including up to the near-infrared light region).

Also in this case, the groove section 105 may be provided only for specific pixels like in FIG. 11C. In FIG. 11D, the groove section 105 is not provided for pixels corresponding to color filters of C1 to C3, and the groove section 105 is provided for pixels corresponding to color filters of C4 (in general, white filters). In this event, the extending direction of the groove section 105 is set to the up and down direction for one color filter of C4, and the extending direction of the groove section 105 is set to the left and right direction for the other color filter of C4.

Further, in FIGS. 11E, 11F, 11G, and 11H, pixels in which groove sections 105 are formed in four directions may be assigned to 2×2 pixels as shown in the combinations of (A) to (D). In FIGS. 11E, 11F, 11G, and 11H, four kinds of directions that make angles of 0 degrees (extending direction pattern A), 45 degrees (extending direction pattern C), 90 degrees (extending direction pattern B), and 135 degrees (extending direction pattern D) with one of the orthogonal axes prescribing the placement position of the pixel are assigned as the extending direction.

Thus, as described with reference to FIGS. 11A, 11B, 11C, 11D, 11E, 11F, 11G, and 11H, groove sections 105 of two or more directions having a difference in direction of substantially 90 degrees are provided in the pixel array section 10 according to the present embodiment.

Here, as mentioned above, the groove section 105 has different reflection characteristics between incident light having a polarization component orthogonal to the extending direction and incident light having a polarization component parallel to the extending direction; the reflection characteristics have a close relationship to the wavelength of incident light and the structure of groove sections 105. Specifically, to maximize polarization sensitivity for ultraviolet light to visible light to near-infrared light, it is preferable to have a structure of a size scale approximately equal to the respective wavelength. Hence, it is preferable that, as schematically shown in FIG. 12, groove sections 105 with a smaller period be provided for a pixel 103 including a wavelength selection filter 115 that allows light of a shorter wavelength to pass, and groove sections 105 with a larger period be provided for a pixel 103 including a wavelength selection filter 115 that allows light of a longer wavelength to pass, in accordance with the transmission region of the wavelength selection filter 115. Thereby, it becomes possible to provide the solid-state imaging element 100 with a more significant sensitivity difference for polarization from the ultraviolet light region to the near-infrared light region.

Hereinabove, the structure of the pixel array section 10 included in the solid-state imaging element 100 according to the present embodiment is described in detail with reference to FIGS. 3, 4, 5, 6A, 6B, 7, 8, 9, 10, 11A, 11B, 11C, 11D, 11E, 11F, 11G, 11H, and 12.

<With Regard to Processing of Calculating Polarization Parameters>

Figure 13:
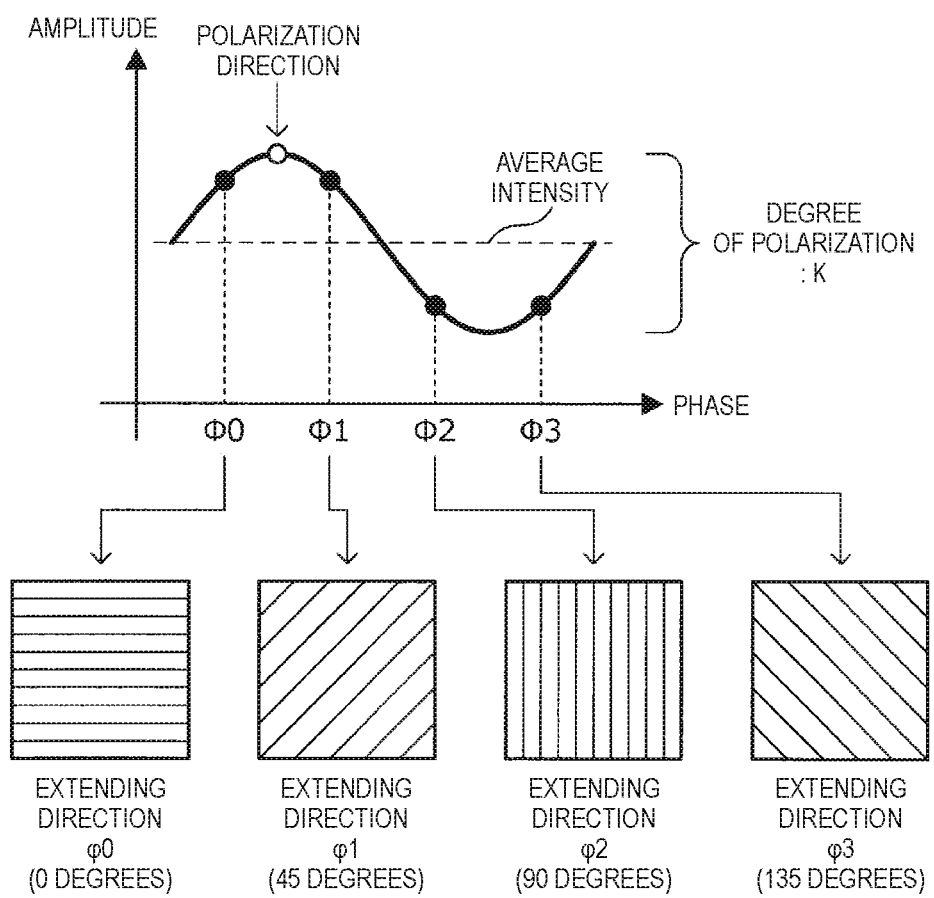
FIG. 13 is an explanatory diagram for describing processing of calculating polarization parameters in a solid-state imaging element according to the embodiment.

By using a light receiving element like that described above that has sensitivity to polarized light selectively, it becomes possible to calculate polarization parameters such as the intensity and the orientation angle of polarization. In the following, the processing of calculating polarization parameters is briefly described with reference to FIG. 13. FIG. 13 is an explanatory diagram for describing the processing of calculating polarization parameters in a solid-state imaging element according to the present embodiment.

Note that, in the following, a case where polarization parameters are calculated from information of intensities of polarization of four orientations is described; however, if information of intensities of polarization of three or more orientations is obtained, calculation can be similarly performed by assuming that "the intensity changes in a sine wave manner with respect to the orientation angle of polarization." Furthermore, even in a case where there is only information of intensities of polarization equivalent to two orientations, some effects can be obtained by using an approximate method, such as assuming that "a smaller intensity corresponds to a case where the intensity of polarization is at the minimum, and a larger intensity corresponds to a case where the intensity of polarization is at the maximum."

In FIG. 13, the polarization orientation angle (that is, serving also as the extending direction of the groove section 105) is set to four orientations of 0 degrees, 45 degrees, 90 degrees, and 135 degrees, and they are denoted by $\varphi 0$, $\varphi 1$, $\varphi 2$, and $\varphi 3$, respectively. As shown in FIG. 13, if the horizontal axis represents the phase of the orientation angle of polarized light and the vertical axis represents the amplitude, the orientation at which the maximum amplitude is obtained can be taken as the orientation angle of polarized light, and the amplitude from the average amplitude can be taken as the degree of polarization. Here, if pixels having sensitivity to polarized light have a separation performance of 0/100 for a pixel parallel to linearly polarized light and a pixel orthogonal to the linearly polarized light, the intensity of polarization can be directly calculated by the method mentioned above (a case where the degree of polarization $\kappa=1$), but in practice a value of 0 to 1 acts as the coefficient $\kappa$.

Further, even if fitting with a sine wave like that shown in FIG. 13 is not performed, the orientation angle of polarized light and the degree of polarization can be calculated from information of intensities of polarization by holding, in advance, relationships between information of intensities of polarization, and orientation angles of polarized light and degrees of polarization, in a data format such as a look-up table.

<With Regard to Configurations of Imaging Devices>

Next, configurations of an imaging device 1 including the solid-state imaging element 100 according to the present embodiment are briefly described with reference to FIGS. 14A, 14B, 14C, 14D, and 14E. FIGS. 14A, 14B, 14C, 14D, and 14E are explanatory diagrams schematically showing configurations of imaging devices each including a solid-state imaging element according to the present embodiment.

The imaging device 1 according to the present embodiment includes at least a solid-state imaging element 100 like that described above and an optical system 200 that guides light to the solid-state imaging element 100.

Examples of such an imaging device 1 include an imaging device 1 like that shown in FIG. 14A. In the present example, it is assumed that a pixel array section 10 in which groove sections 105 of extending directions such as $\varphi 0$ and $\varphi 2$ like those shown in FIG. 13 are formed is provided in the solid-state imaging element 100. Incident light is, by an arbitrary optical system 200, caused to form an image on the pixel array section 10 of the solid-state imaging element 100, and an image output from the pixel array section 10 is subjected to signal processing like that described above by the signal processing section 60. After that, the image output subjected to signal processing is stored in the data storage section 70 or a storage provided outside the solid-state imaging element 100. Further, the driving of the solid-state imaging element 100 and the optical system 200 provided in the imaging device 1 is controlled by a driving section 300.

In a case where it is intended to calculate polarization parameters using an imaging device 1 like that shown in FIG. 14A, the obtained information of the intensity of polarization is limited to two directions (in the example of FIG. 14A, $\varphi 0$ and $\varphi 2$); thus, the polarization parameters are calculated approximately. Therefore, in a case where polarization parameters are calculated using an imaging device 1 like that shown in FIG. 14A, it is presumed that, for example, a specific use such as "lessening scattered light components of sunlight in a blue sky" is taken as a precondition.

Further, as shown in FIG. 14B, it may be possible to provide a retardation film on some of the pixels in the pixel array section 10. Thereby, a phase difference further occurs between a pixel provided with the retardation film and a pixel not provided with the retardation film; thus, unlike in the example shown in FIG. 14A, it becomes possible to obtain information of intensities of polarization of three or more orientations using one solid-state imaging element 100. Note that, although in the example shown in FIG. 14B the arrangement of pixels provided with retardation films is a zigzag arrangement, the arrangement pattern of such retardation films is not limited to the example shown in FIG. 14B.

Although the examples shown in FIG. 14A and FIG. 14B are a monocular imaging device 1 in which one solid-state imaging element 100 is mounted, it is also possible to design a compound eye imaging device 1 in which two solid-state imaging elements 100 are mounted, as shown in FIG. 14C. In the example shown in FIG. 14C, it is assumed that a pixel array section 10 in which groove sections 105 of extending directions such as $\varphi 0$ and $\varphi 2$ like those shown in FIG. 13 are formed is provided in each solid-state imaging element 100. Incident light is caused to form images on pixel array sections 10A and 10B by arbitrary optical systems 200A and 200B, respectively. In this event, a retardation film is not provided between the optical system 200A and the pixel array section 10A, whereas a retardation film is provided between the optical system 200B and the pixel array section 10B. Image outputs from the pixel array sections 10A and 10B are subjected to signal processing like that described above by signal processing sections 60A and 60B, respectively. Each image output subjected to signal processing is outputted to a common signal processing section 400, and is subjected to, for example, the processing of calculating polarization parameters like that shown in FIG. 13 or image processing such as suppressing or emphasizing polarized light like that described later. An image signal outputted from the common signal processing section 400 is stored in the data storage section 70 or a storage provided outside the solid-state imaging element 100. Further, the driving of each pixel array 10 and each optical system 200 provided in the imaging device 1 is controlled by the driving section 300. Note that the common signal processing section 400 may include various electric circuits, or may be various IC chips or the like including a central processing unit (CPU), a read-only memory (ROM), a random access memory (RAM), etc.

Here, in the compound eye imaging device 1 shown in FIG. 14C, the arrangement pattern of groove sections 105 in the pixel array section 10 is the same; but a retardation film is provided on the optical path between one pixel array section 10 and one optical system 200, and thereby it becomes possible to acquire polarization components of four or more orientations. Thus, it becomes possible to calculate polarization parameters such as the orientation angle of polarized light and the degree of polarization more accurately.

Note that, although in FIG. 14C a retardation film is provided on the optical path between one pixel array section 10 and one optical system 200, two kinds of retardation films having different phase differences may be provided on both optical paths, for example as shown in FIG. 14D.

Further, although in FIG. 14C and FIG. 14D the extending directions of groove sections 105 in both pixel array sections 10 are the same as each other, the extending direction of the groove section 105 in one pixel array section 10 and the extending direction of the groove section 105 in the other pixel array section 10 may be different, as shown in FIG. 14E. By employing a configuration like that shown in FIG. 14E, it becomes possible to acquire polarization components of three or more orientations without using a retardation film.

Hereinabove, configurations of the imaging device 1 including the solid-state imaging element 100 according to the present embodiment are briefly described with reference to FIGS. 14A, 14B, 14C, 14D, and 14E.

<With Regard to Flow of Image Output Processing in Imaging Device>

Figure 15:
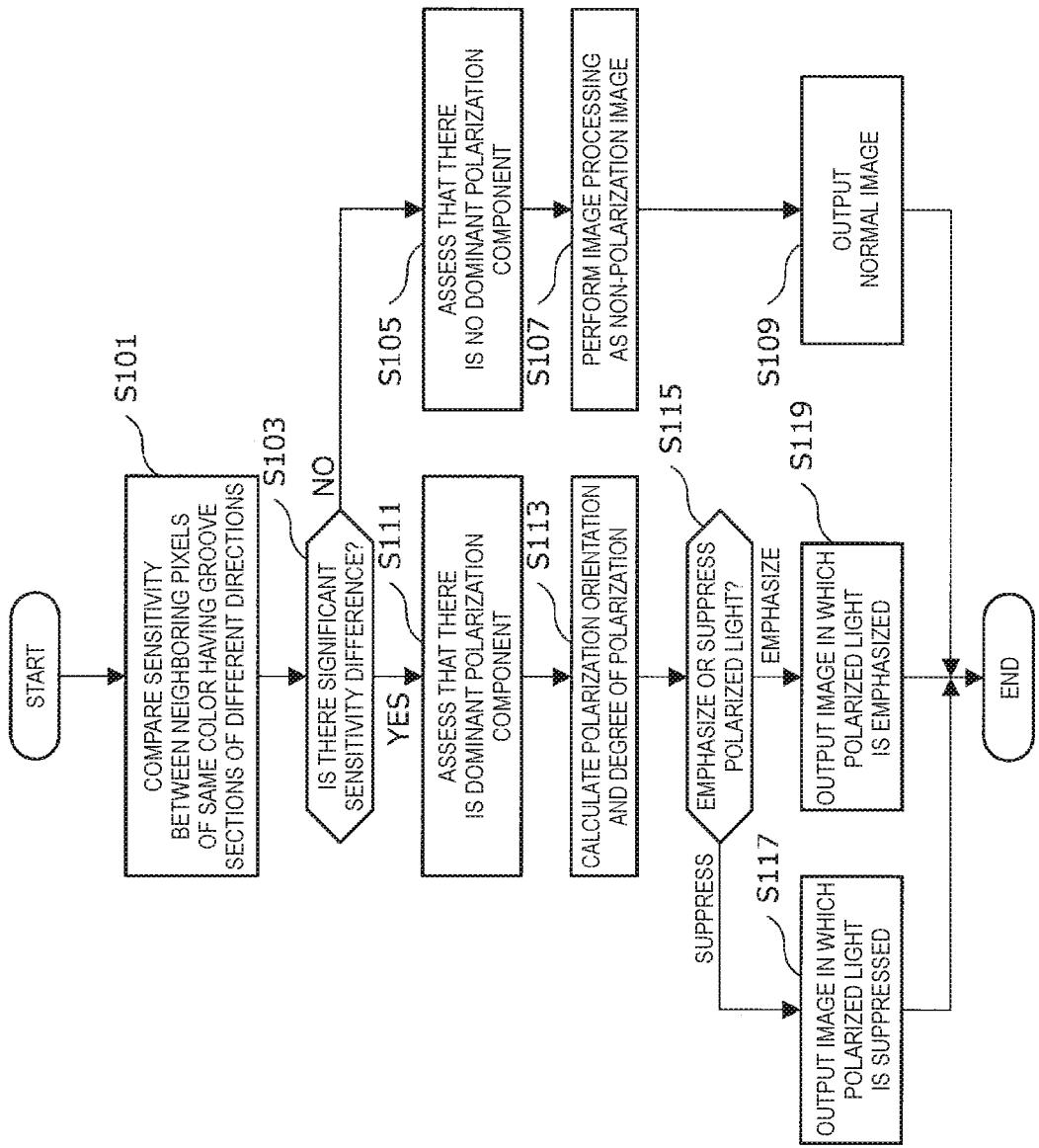
FIG. 15 is a flow chart showing an example of a flow of image output processing in an imaging device according to the embodiment.

Next, a flow of image output processing in an imaging device according to the present embodiment is briefly described with reference to FIG. 15. FIG. 15 is a flow chart showing an example of the flow of image output processing in an imaging device according to the present embodiment. Note that image output processing like that described below is performed by, for example, the signal processing section 60 included in the solid-state imaging element 100, the common signal processing section 400 included in the imaging device 1, or the like.

In image output processing according to the present embodiment, first, the intensity of detected light is compared between neighboring pixels 103 of the same color having groove sections 105 of different directions (step S101). Specifically, the common signal processing section 400 or the like assesses whether a significant sensitivity difference exists in the intensity of detected light between the pixels to be compared or not (step S103).

In a case where a significant sensitivity difference does not exist, the common signal processing section 400 or the like assesses that there is no dominant polarization component (step S105), performs image processing as a non-polarization image (step S107), and outputs a normal image (step S109).

On the other hand, in a case where a significant sensitivity difference exists, the common signal processing section 400 or the like assesses that a dominant polarization component exists (step S111), and calculates the polarization orientation and the degree of polarization by the method described above (step S113). After that, the common signal processing section 400 or the like refers to a set value previously set in the imaging device 1 etc., or has the user select what kind of processing to perform; thereby, assesses whether to emphasize or suppress polarized light (step S115). In a case of suppressing polarized light, the common signal processing section 400 or the like outputs an image in which polarized light is suppressed (step S117). On the other hand, in a case of emphasizing polarized light, the common signal processing section 400 or the like outputs an image in which polarized light is emphasized (step S119).

Thus, in the solid-state imaging element 100 according to the present embodiment, some of the pixels are provided with the groove section 105, and thereby it becomes possible to identify information of the intensity ratio between a polarization component in a specific direction and a non-polarization nature, and the orientation angle of polarized light and the degree of polarization. By utilizing these pieces of information to perform image processing like that mentioned above, it becomes possible to perform various pieces of image processing, such as creating an image in which reflection light components are lessened and creating an image in which reflection light components are emphasized, for example.

<With Regard to Method for Manufacturing Solid-State Imaging Element>

Figure 16:
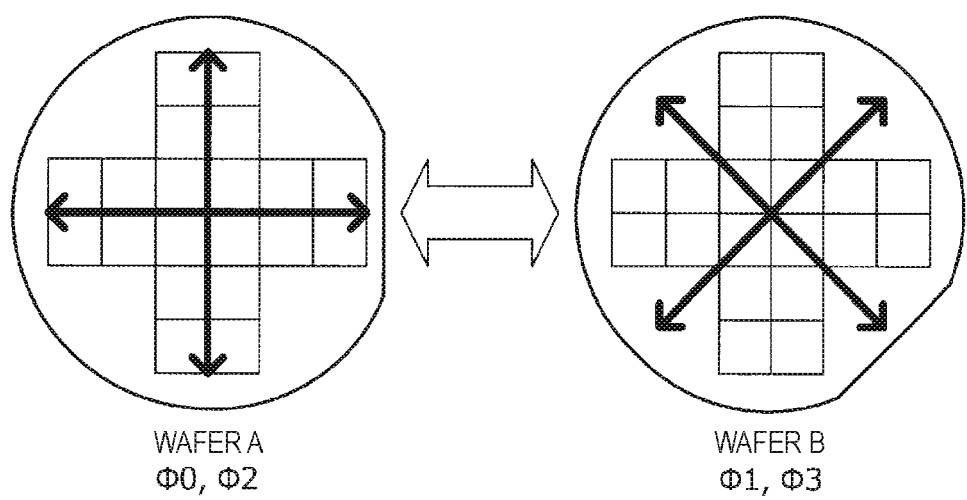
FIG. 16 is an explanatory diagram for describing a method for manufacturing a solid-state imaging element according to the embodiment.

Next, a method for manufacturing a solid-state imaging element according to the present embodiment is described with reference to FIG. 16. FIG. 16 is an explanatory diagram for describing a method for manufacturing a solid-state imaging element according to the present embodiment.

A method for manufacturing a solid-state imaging element according to the present embodiment includes a step of forming groove sections extended along a prescribed direction, on a surface of a matrix functioning as a light receiving element included in a plurality of pixels; and a solid-state imaging element is manufactured by setting, as the directions in which the groove section is extended, two or more directions including at least mutually orthogonal two directions. Hereinbelow, an example of such a method for manufacturing a solid-state imaging element is described.

In a method for manufacturing a solid-state imaging element according to the present embodiment, first, a known photoresist is applied to a surface of a matrix functioning as a light receiving element, and the positions of pixels on which groove sections 105 are to be formed are patterned. After that, for example, anisotropic etching by wet etching is performed using a known etchant such as a potassium hydroxide (KOH) solution, and groove sections 105 (and trench structures 109 etc., as necessary) are formed.

Note that, when performing anisotropic etching, also ethylenediamine pyrocatechol (EDP), tetramethylammonium hydroxide (TMAH), hydrazine hydrate ($N_2H_4.H_2O$), and the like may be used as well as a potassium hydroxide solution.

After the groove sections 105 are formed, intermediate layers such as the dielectric layer 107 and the dielectric multiple-layer film 121 are formed using a material like that described above. The film formation method for such intermediate layers is not particularly limited, and known methods such as chemical vapor deposition (CVD), plasma-enhanced chemical vapor deposition (PCVD), and atomic layer deposition (ALD) may be used.

After that, the flattening film 111 is formed using a transparent dielectric material such as $SiO_2$ or SiN. The method for forming the flattening film 111 is not particularly limited, and known methods such as CVD, vacuum vapor deposition, sputtering, thermal CVD, and plasma-enhanced CVD may be used.

After the flattening film 111 is formed in this way, the wavelength selection filter 115 and the light collecting structure element 117 are sequentially formed using known materials like those described above. Thereby, the pixel array section 10 of the solid-state imaging element 100 according to the present embodiment can be manufactured.

Note that, as mentioned above, it is convenient to use single-crystal silicon as a matrix functioning as the light receiving element 101; in this case, it is preferable to form the groove section 105 using the (100) plane of single-crystal silicon. By performing anisotropic etching on such a Si (100) plane, a groove section 105 utilizing the Si (111) plane can be formed. However, in a case of a solid-state imaging element using single-crystal silicon, the orientation of the crystallographic axis is determined in advance, and hence the groove section 105 utilizing the Si (111) plane cannot be mounted at an arbitrary orientation. However, a pixel array section 10 having groove sections 105 of different orientation angles can be obtained relatively conveniently by manufacturing a solid-state imaging element using wafers of different orientations, as shown in FIG. 16.

Hereinabove, a method for manufacturing a solid-state imaging element according to the present embodiment is described with reference to FIG. 16.

(Conclusions)

As described hereinabove, a solid-state imaging element according to an embodiment of the present disclosure functions as a pixel having different reflection and absorption characteristics for incident light having a polarization component, while functioning as a pixel of an ordinary image sensor for non-polarized incident light.

More specifically, groove sections provided in a solid-state imaging element according to an embodiment of the present disclosure function as, for non-polarized light, a good-quality anti-reflection film having a low reflectance in a wide region from the entire visible light wavelength region to infrared light.

Further, groove sections according to an embodiment of the present disclosure function as, for light having a polarization component, a sensor surface that has different reflection characteristics between incident light having a polarization component parallel to the extending direction of the groove section and incident light having a polarization component orthogonal to the extending direction. As a result, a pixel that has an almost equal sensitivity to the sensitivity to a non-polarization component and on the other hand has a different sensitivity to a polarization component is obtained.

By utilizing features like the above to fit sensitivity differences with a specific function from sensed sensitivity differences of the pixel or to compare sensitivity differences with values in a look-up table, it becomes possible to specify the orientation angle of polarized light and the degree of polarization. By utilizing such information, it becomes possible to emphasize or suppress a polarization component on a captured image.

Note that, in a case where a solid-state imaging element according to an embodiment of the present disclosure is manufactured by utilizing a crystal plane of single-crystal silicon, the increase in the surface area of silicon can be kept finite. As a result, the worsening of various characteristics as a solid-state imaging element, such as increases in the levels of dark current, random noise, and white spots derived from crystal defects of a semiconductor crystal, can be suppressed. Further, since a groove section can be formed by utilizing the plane orientation dependence of single-crystal silicon, it becomes possible to obtain a groove section of a correct size in a correct position, and stable manufacturing with small individual variations becomes possible.

Example

In the following, the solid-state imaging element according to the present disclosure is specifically described while Example is shown. Note that Example shown below is only examples of the solid-state imaging element according to the present disclosure, and the solid-state imaging element according to the present disclosure is not limited to the following examples.

In the following, using an electromagnetic field analysis using the finite-difference time-domain method (FDTD simulation), a simulation was performed on differences in sensitivity characteristics for polarization between pixels in which groove sections according to the present disclosure are formed. Note that each of the width w and the interval p of the groove section 105 was set to 300 nm or 400 nm.

Further, when performing the simulation, single-crystal silicon with a pixel size of 1.2 µm×1.2 µm and a thickness of 3 µm was simulated, and a solid-state imaging element of what is called the Bayer arrangement, in which 2×2 pixels include pixels of three colors of RGB, was used as a model.

Figure 17:
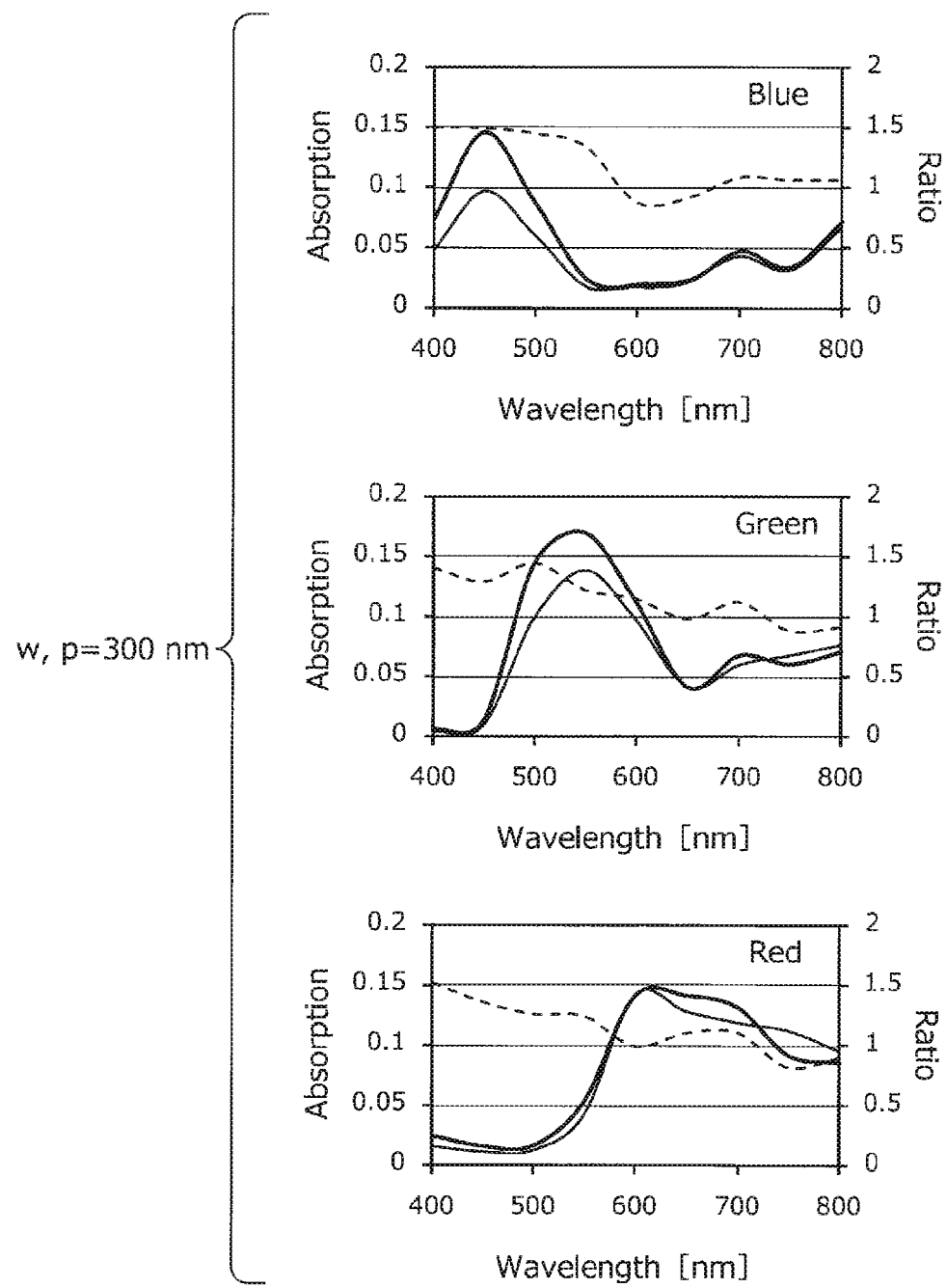
FIG. 17 is graphs showing simulation results regarding a solid-state imaging element according to the embodiment.
Figure 18:
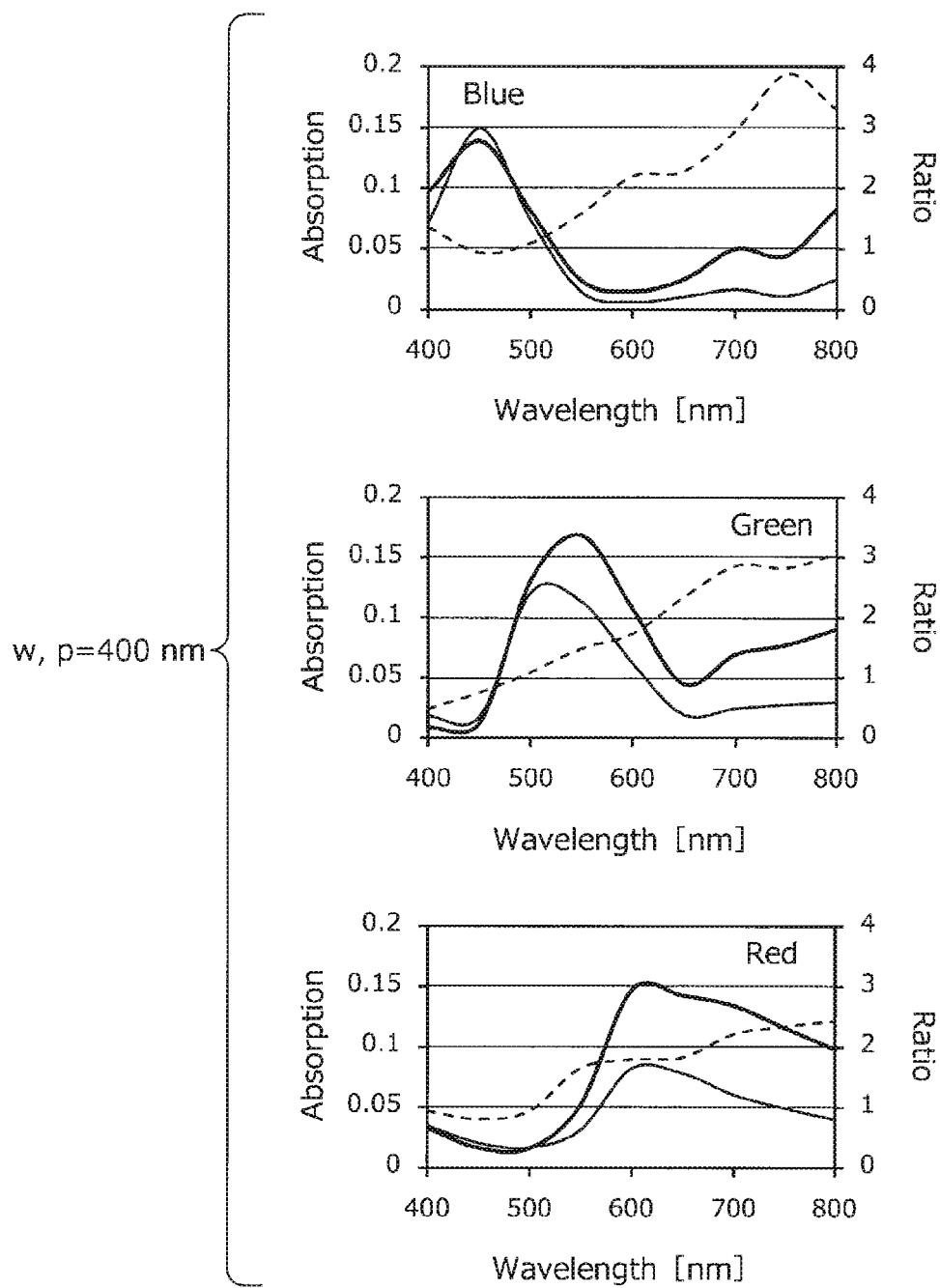
FIG. 18 is graphs showing simulation results regarding a solid-state imaging element according to the embodiment.

FIG. 17 shows simulation results in a case where the width w and the interval p of the groove section 105 were set to 300 nm, and FIG. 18 shows simulation results in a case where the width w and the interval p of the groove section 105 were set to 400 nm. In FIG. 17 and FIG. 18, the horizontal axis represents the wavelength of the incident electromagnetic wave (400 nm to 800 nm), and the vertical axis represents the amount of light absorption of the pixel. Further, in each drawing, the thick line indicates a component orthogonal to the extending direction of the groove section, and the thin line indicates a component parallel to the extending direction of the groove section. Further, in each drawing, the ratio of pixel sensitivity between the parallel component and the orthogonal component is shown by the broken line.

First, focusing attention on FIG. 17, it can be seen that, for the Blue pixel and the Green pixel, the sensitivity to the parallel component is approximately 50% higher than the sensitivity to the orthogonal component, and in the Red pixel, the ratio between both is relatively small.

Further, focusing attention on FIG. 18, it can be seen that, for the Red pixel and the Green pixel, the sensitivity to the parallel component is approximately 50% to 100% higher than the sensitivity to the orthogonal component, and in the Blue pixel, the ratio between both is relatively small.

Thus, it has been revealed that, by providing groove sections like those described above on a surface of a light receiving element, it becomes possible to provide a pixel with polarization sensitivity.

The preferred embodiment(s) of the present disclosure has/have been described above with reference to the accompanying drawings, whilst the present disclosure is not limited to the above examples. A person skilled in the art may find various alterations and modifications within the scope of the appended claims, and it should be understood that they will naturally come under the technical scope of the present disclosure.

Further, the effects described in this specification are merely illustrative or exemplified effects, and are not limitative. That is, with or in the place of the above effects, the technology according to the present disclosure may achieve other effects that are clear to those skilled in the art from the description of this specification.

Additionally, the present technology may also be configured as below.

(1)

A solid-state imaging element including:

a light receiving element included in a plurality of pixels; and a groove section provided on surfaces of at least some of the pixels in the light receiving element and extended along a prescribed direction, in which two or more directions including at least mutually orthogonal two directions exist as a direction in which the groove section is extended.

(2)
  The solid-state imaging element according to (1),
  in which, as the groove section, at least
    a first groove section provided on surfaces of some of the pixels in the light receiving element and extended along a first direction, and
    a second groove section provided on surfaces of some of the pixels in the light receiving element and extended along a second direction orthogonal to the first direction
  are provided.
(3)
  The solid-state imaging element according to (1) or (2),
  in which a cross-sectional shape of the groove section is a substantially V-like shape or a tapered shape.
(4)
  The solid-state imaging element according to any one of (1) to (3),
  in which a plurality of the groove sections are provided on a light receiving surface of each pixel, and
  an interval between mutually adjacent ones of the groove sections and a width of the groove section are each in a range of 100 nm to 1000 nm.
(5)
  The solid-state imaging element according to any one of (1) to (4),
  in which a plurality of the groove sections are provided on a light receiving surface of each pixel, and
  an interval between mutually adjacent ones of the groove sections and a width of the groove section are each a size of one over an integer of a pixel size.
(6)
  The solid-state imaging element according to any one of (1) to (5),
  in which the pixel provided with the groove section exhibits a different reflection characteristic or a different absorption characteristic for incident light polarized in a specific direction.
(7)
  The solid-state imaging element according to any one of (1) to (6),
  in which a dielectric layer containing a high-permittivity (high-k) material as a main component is provided on a surface of the groove section.
(8)
  The solid-state imaging element according to any one of (1) to (7),
  in which a dielectric multiple-layer film having a shape similar to a shape of the groove section is further provided on the groove section.
(9)
  The solid-state imaging element according to any one of (1) to (8),
  in which a trench structure is provided between mutually adjacent ones of the pixels.
(10)
  The solid-state imaging element according to (9),
  in which the trench structure is a metal trench structure containing, as a main component, a metal that reflects or absorbs visible light and near-infrared light.
(11)
  The solid-state imaging element according to (10),
  in which the metal that reflects or absorbs visible light and near-infrared light is at least one metal selected from the group consisting of tungsten, titanium, copper, and aluminum, and
  an alloy of these.
(12)
  The solid-state imaging element according to (9),
  in which the trench structure is a trench structure containing a dielectric material as a main component.
(13)
  The solid-state imaging element according to (12),
  in which the dielectric material is a dielectric material that reflects or absorbs the visible light and the near-infrared light, or a high-permittivity (high-k) material.
(14)
  The solid-state imaging element according to (13),
  in which the dielectric material that reflects or absorbs the visible light and the near-infrared light is $SiO_2$ or SiN.
(15)
  The solid-state imaging element according to (13),
  in which the high-permittivity (high-k) material is HfO, $Ta_2O_5$, or $TiO_2$.
(16)
  The solid-state imaging element according to any one of (1) to (15),
  in which the direction in which the groove section is extended is substantially parallel to a direction making an angle of 0 degrees, 45 degrees, 90 degrees, or 135 degrees with one of orthogonal axes prescribing a placement position of the pixel.
(17)
  The solid-state imaging element according to any one of (1) to (16),
  in which the light receiving element contains single-crystal silicon, and
  at least a part of the groove section is formed using a Si (111) plane.
(18)
  An imaging device including at least:
    a solid-state imaging element including
      a light receiving element included in a plurality of pixels, and
      a groove section provided on surfaces of at least some of the pixels in the light receiving element and extended along a prescribed direction,
      in which two or more directions including at least mutually orthogonal two directions exist as a direction in which the groove section is extended; and
    an optical system configured to guide light to the solid-state imaging element.
(19)
  The imaging device according to (18),
  in which a retardation film is provided on some of the pixels in the solid-state imaging element.
(20)
  The imaging device according to (18), including:
    two or more of the solid-state imaging elements,
    in which directions in which the groove sections in the solid-state imaging elements are extended are the same as each other, and
    a retardation film is provided on an optical path between at least one of the solid-state imaging elements and the optical system.
(21)
  The imaging device according to (18), including:
    two or more of the solid-state imaging elements,
    in which a direction in which the groove section in one of the solid-state imaging elements is extended and a direction in which the groove section in another of the solid-state imaging elements is extended are different.

(22)

The imaging device according to any one of (18 to (21), further including:

a signal processing section configured to, on a basis of intensity information of incident light outputted from the solid-state imaging element, calculate at least one of an orientation angle and a degree of polarization of polarized light incident on the solid-state imaging element.

(23)

A method for manufacturing a solid-state imaging element, including:

forming a groove section extended along a prescribed direction, on a surface of a matrix functioning as a light receiving element included in a plurality of pixels, in which two or more directions including at least mutually orthogonal two directions are set as a direction in which the groove section is extended.

REFERENCE SIGNS LIST 10 pixel array section
20 vertical driving section
30 column processing section
40 horizontal driving section
50 system control section
60 signal processing section
70 data storage section
101 light receiving element
103 pixel
105 groove section
107 dielectric layer
109 trench structure
111 flattening film
113 light blocking section
115 wavelength selection filter
117 light collecting structure element
119 metal trench structure
121 dielectric multiple-layer film

The invention claimed is:

1. A solid-state imaging element, comprising:
a plurality of pixels;
a light receiving element in a pixel of the plurality of pixels;
a plurality of groove sections on a surface of the light receiving element, wherein
the plurality of groove sections extends along an extending direction, and
the extending direction is one of a plurality of directions that includes at least two mutually orthogonal directions;
a flattening film on the plurality of groove sections, wherein the flattening film flattens the surface of the light receiving element;
a wavelength selection filter on the flattening film, wherein the wavelength selection filter is in contact with the flattening film; and
a dielectric multiple-layer film between a groove section of the plurality of groove sections and the flattening film, wherein
a shape of the dielectric multiple-layer film is similar to a shape of the groove section,
the dielectric multiple-layer film comprises at least two dielectric layers with mutually different refractive indices, and
each dielectric layer of the at least two dielectric layers has an optical thickness of approximately $\lambda/4N_\lambda$, where $\lambda$ represents a center wavelength of light transmitted through the wavelength selection filter and $N_\lambda$ represents a refractive index of a corresponding dielectric layer of the at least two dielectric layers.

2. The solid-state imaging element according to claim 1, wherein, as the groove section, at least
a first groove section provided on surfaces of some of the plurality of pixels in the light receiving element and extended along a first direction, and
a second groove section provided on surfaces of some of the plurality of pixels in the light receiving element and extended along a second direction orthogonal to the first direction are provided.

3. The solid-state imaging element according to claim 1, wherein a cross-sectional shape of the groove section of the plurality of groove sections is one of a V-like shape or a tapered shape.

4. The solid-state imaging element according to claim 1, wherein
the plurality of groove sections is on a light receiving surface of each pixel of the plurality of pixels, and
each of an interval between mutually adjacent groove sections of the plurality of groove sections and a width of the groove section of the plurality groove sections is in a range of 100 nm to 1000 nm.

5. The solid-state imaging element according to claim 1, wherein
the plurality of groove sections is on a light receiving surface of each pixel of the plurality of pixels, and
an interval between mutually adjacent groove sections of the plurality of groove sections and a width of the groove section of the plurality groove sections are each a size of one over an integer of a pixel size.

6. The solid-state imaging element according to claim 1, wherein the pixel is configured to exhibit one of a specific reflection characteristic or a specific absorption characteristic for incident light polarized in a specific direction.

7. The solid-state imaging element according to claim 1, further comprising a specific dielectric layer on a surface of the groove section of the plurality of groove sections, wherein the specific dielectric layer has a high permittivity (high k) material as a main component.

8. The solid-state imaging element according to claim 1, further comprising a trench structure between mutually adjacent pixels of the plurality of pixels.

9. The solid-state imaging element according to claim 8, wherein the trench structure is a metal trench structure that comprises, as a main component, a metal configured to one of reflect or absorb visible light and near-infrared light.

10. The solid-state imaging element according to claim 9, wherein the metal comprises one of tungsten, titanium, copper, aluminum, or an alloy of these.

11. The solid-state imaging element according to claim 8, wherein a main component of the trench structure is a dielectric material.

12. The solid-state imaging element according to claim 11, wherein
the dielectric material is one of a specific material or a high-permittivity (high-k) material, and
the specific material is configured to one of reflect or absorb visible light and near-infrared light.

13. The solid-state imaging element according to claim 12, wherein the dielectric material comprises one of $SiO_2$ or SiN.

14. The solid-state imaging element according to claim 12, wherein the high-permittivity (high-k) material comprises one of HfO, $Ta_2O_5$, or $TiO_2$.

15. The solid-state imaging element according to claim 1, wherein a direction in which the groove section is extended is substantially parallel to a direction making an angle of 0 degrees, 45 degrees, 90 degrees, or 135 degrees with one of orthogonal axes prescribing a placement position of the pixel.

16. The solid-state imaging element according to claim 1, wherein
the light receiving element comprises single-crystal silicon, and
at least a part of the groove section of the plurality of groove sections comprises an Si(111) plane.

17. An imaging device, comprising:
a solid-state imaging element including:
a plurality of pixels;
a light receiving element in a pixel of the plurality of pixels;
a plurality of groove sections on a surface of the light receiving element, wherein
the plurality of groove sections extends along an extending direction, and
the extending direction is one of a plurality of directions that includes at least two mutually orthogonal directions;
a flattening film on the plurality of groove sections, wherein the flattening film flattens the surface of the light receiving element;
a wavelength selection filter on the flattening film, wherein the wavelength selection filter is in contact with the flattening film; and
a dielectric multiple-layer film between a groove section of the plurality of groove sections and the flattening film, wherein
a shape of the dielectric multiple-layer film is similar to a shape of the groove section,
the dielectric multiple-layer film comprises at least two dielectric layers with mutually different refractive indices, and
each dielectric layer of the at least two dielectric layers has an optical thickness of approximately $\lambda/4N_\lambda$,
where $\lambda$ represents a center wavelength of first light transmitted through the wavelength selection filter and $N_\lambda$ represents a refractive index of a corresponding dielectric layer of the at least two dielectric layers; and
an optical system configured to guide second light to the solid-state imaging element.

18. The imaging device according to claim 17, wherein a retardation film is provided on some of the plurality of pixels in the solid-state imaging element.

19. The imaging device according to claim 17, further comprising:
two or more of the solid-state imaging elements,
wherein directions in which the plurality of groove sections in the solid-state imaging elements are extended are the same as each other, and
a retardation film is provided on an optical path between at least one of the solid-state imaging elements and the optical system.

20. The imaging device according to claim 17, further comprising:
two or more of the solid-state imaging elements,
wherein a direction in which the groove section in one of the solid-state imaging elements is extended and a direction in which the groove section in another of the solid-state imaging elements is extended are different.

21. The imaging device according to claim 17, further comprising a signal processing section configured to calculate, based on intensity information of the second light, at least one of an orientation angle and a degree of polarization of polarized light incident on the solid-state imaging element.

* * * * *